US012651545B2

(12) United States Patent
Kim et al.

(10) Patent No.: US 12,651,545 B2
(45) Date of Patent: Jun. 9, 2026

(54) DISPLAY DEVICE HAVING A PLURALITY OF PAD LAYERS AND METHOD OF MANUFACTURING THE SAME

(71) Applicant: Samsung Display Co., LTD., Yongin-si (KR)

(72) Inventors: Mi Sun Kim, Yongin-si (KR); Dong Sung Lee, Yongin-si (KR); Yong Hoon Kwon, Yongin-si (KR); Byung Hoon Kim, Yongin-si (KR); Tae Oh Kim, Yongin-si (KR); Jeong Jin Park, Yongin-si (KR); Se Hun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 405 days.

(21) Appl. No.: 18/103,704

(22) Filed: Jan. 31, 2023

(65) Prior Publication Data

US 2023/0387052 A1 Nov. 30, 2023

(30) Foreign Application Priority Data

May 30, 2022 (KR) ........................ 10-2022-0066249

(51) Int. Cl.
| | |
|---|---|
| *G09G 3/20* | (2006.01) |
| *H10W 70/67* | (2026.01) |
| *H10W 72/00* | (2026.01) |
| *H10W 72/90* | (2026.01) |

(52) U.S. Cl.
CPC ............ *G09G 3/20* (2013.01); *H10W 70/688* (2026.01); *G09G 2300/0408* (2013.01); *H10W 72/01921* (2026.01); *H10W 72/9223* (2026.01); *H10W 72/923* (2026.01); *H10W 72/952* (2026.01)

(58) Field of Classification Search
CPC ....... G09G 3/20; H01L 24/05; H01L 23/4985; H01L 24/03; H10K 59/80517; H10K 59/80523; H10W 70/688
See application file for complete search history.

(56) References Cited

U.S. PATENT DOCUMENTS

| | | | |
|---|---|---|---|
| 8,643,019 B2 | 2/2014 | Moon et al. | |
| 9,854,668 B2 | 12/2017 | Sano et al. | |
| 10,163,940 B2 | 12/2018 | Kubota et al. | |
| 11,659,750 B2 | 5/2023 | Kim et al. | |
| 2017/0257939 A1* | 9/2017 | Sano ..................... | H05K 1/028 |

FOREIGN PATENT DOCUMENTS

| | | |
|---|---|---|
| JP | 2017-161887 | 9/2017 |
| KR | 10-2012-0063746 A | 6/2012 |
| KR | 10-2022-0041970 A | 4/2022 |
| KR | 10-2392523 | 4/2022 |

* cited by examiner

*Primary Examiner* — Suberr L Ch

(74) *Attorney, Agent, or Firm* — Womble Bond Dickinson (US) LLP

(57) ABSTRACT

A display device includes a base layer including an upper base layer and a lower base layer on a rear surface of the upper base layer; at least one light emitting element on a surface of the upper base layer; and at least one pad on the rear surface of the upper base layer and including a first pad layer adjacent to the upper base layer and a second pad layer adjacent to the lower base layer. The second pad layer includes indium zinc oxide (IZO).

13 Claims, 20 Drawing Sheets

DR3

BSL: 120, 140, 160
140: 142, 144
PAD: P1, P2, PEP
1000: 1120, 1140

PXL(SPXL): SPXL1, SPXL2, SPXL3

PXL(SPXL): SPXL1, SPXL2, SPXL3

BSL

PCL

120

142

144

160

140: 142, 144

DR3

BSL: 120, 140, 160
140: 142, 144
PAD: P1, P2, PEP

BSL: 120, 140, 160
140: 142, 144
PAD: P1, P2, PEP
1000: 1120, 1140

BSL: 120, 140, 160
140: 142, 144
PAD: P1, P2, PEP
1000: 1120, 1140

BSL: 120, 140, 160
140: 142, 144
PAD: P1, P2, PEP
1000: 1120, 1140

DR3

BSL: 120, 140, 160
140: 142, 144
PAD: P1, P2, PEP

— DPL

— PCL

— BSL'

DR3

140: 142, 144
PAD: P1, P2, PEP

140: 142, 144
PAD: P1, P2, PEP
1000: 1120, 1140

140: 142, 144
PAD: P1, P2, PEP

DISPLAY DEVICE HAVING A PLURALITY OF PAD LAYERS AND METHOD OF MANUFACTURING THE SAME

CROSS-REFERENCE TO RELATED APPLICATION

The application claims priority to and benefits of Korean Patent Application No. 10-2022-0066249 under 35 U.S.C. § 119, filed in the Korean Intellectual Property Office (KIPO) on May 30, 2022, the entire contents of which are incorporated herein by reference.

BACKGROUND

1. Technical Field

The disclosure relates to a display device and a method of manufacturing the same without damage to pads and having improved reliability of an electrical signal.

2. Description of the Related Art

With the development of information technology, the importance of display devices, which are a connection medium between users and information, has been emphasized. In response to this, the use of display devices such as a liquid crystal display device, an organic light emitting display device, and the like has been increasing.

The position of a driving chip for driving a pixel in a display device may be variously determined. For example, the driving chip may be disposed on a rear surface of the display device. In this case, pads for electrically connecting the driving chip to components of the display device may be disposed adjacent to the rear surface of the display device. Meanwhile, the pads may function as a path of an electrical signal that may be provided to the pixel of the display device. Accordingly, there is a need to prevent damage to the pads.

It is to be understood that this background of the technology section is, in part, intended to provide useful background for understanding the technology. However, this background of the technology section may also include ideas, concepts, or recognitions that were not part of what was appreciated by those skilled in the pertinent art prior to a corresponding effective filing date of the subject matter disclosed herein.

SUMMARY

An object of the disclosure is to provide a display device capable of substantially improving reliability of an electrical signal by preventing damage to pads.

Another objection is to provide a method of manufacturing the same.

However, embodiments of the disclosure are not limited to those set forth herein. The above and other embodiments will become more apparent to one of ordinary skill in the art to which the disclosure pertains by referencing the detailed description of the disclosure given below.

A display device according to one or more embodiments of the disclosure may include a base layer including an upper base layer and a lower base layer on a rear surface of the upper base layer; at least one light emitting element on a surface of the upper base layer; and at least one pad on the rear surface of the upper base layer and including a first pad layer adjacent to the upper base layer and a second pad layer adjacent to the lower base layer. The second pad layer may include indium zinc oxide (IZO).

According to one or more embodiments, the display device may further include a display area in which a pixel including the at least one light emitting element is disposed; a non-display area adjacent to at least a portion of the display area; a driving chip that provides an electrical signal to the pixel; and a chip-on-film on which the driving chip is provided. The at least one pad may be electrically connected to the chip-on-film, and the chip-on-film and the driving chip may overlap the display area in a plan view.

According to one or more embodiments, the lower base layer may not overlap the second pad layer and form an open area in a plan view.

According to one or more embodiments, the display device may further include a lower connection electrode disposed on the surface of the upper base layer and electrically connected to the at least one pad.

According to one or more embodiments, the at least one pad each may include an extension pad layer. The extension pad layer and the first pad layer may be integral with each other. The lower connection electrode may be electrically connected to the extension pad layer.

According to one or more embodiments, the base layer may further include a barrier layer disposed between the upper base layer and the lower base layer. The barrier layer may include a first barrier layer adjacent to the upper base layer and a second barrier layer adjacent to the lower base layer. The first barrier layer may cover a surface of the first pad layer.

According to one or more embodiments, the upper base layer may include polyimide. The lower base layer may include polyimide. The first barrier layer may have a structure in which a layer including silicon nitride and a layer including silicon oxynitride are alternately disposed. The second barrier layer may have a structure in which a layer including amorphous silicon and a layer including silicon oxide are alternately disposed.

According to one or more embodiments, the second barrier layer may cover a portion of a side surface of the first pad layer, may expose another portion of the side surface of the first pad layer, and may not cover a side surface of the second pad layer, and the at least one pad may protrude with respect to the barrier layer.

According to one or more embodiments, a thickness of the protrusion of the at least one pad protruding with respect to the barrier layer may be greater than a thickness of the second pad layer.

According to one or more embodiments, the thickness of the protrusion may be in a range of about 4,000 Å to about 7,000 Å. The thickness of the second pad layer may be in a range of about 500 Å to about 700 Å.

According to one or more embodiments, the second barrier layer may cover an entire side surface of the first pad layer and may expose at least a portion of a side surface of the second pad layer.

According to one or more embodiments, the second barrier layer may expose an entire side surface of the second pad layer.

According to one or more embodiments, the display device may be provided as a tiled display device including a plurality of display devices.

A method of manufacturing a display device according to one or more embodiments of the disclosure may include forming an unetched base layer; disposing a pixel circuit layer including a lower connection electrode on the unetched base layer; disposing a light emitting element on the pixel circuit layer; and removing at least a portion of the unetched base layer. The forming of the unetched base layer may include providing an upper unetched base layer and a lower unetched base layer; disposing at least one pad on the lower unetched base layer; disposing a barrier layer on the lower unetched base layer; and patterning the upper unetched base layer on the barrier layer. The disposing of the at least one pad may include patterning a second pad layer on the lower unetched base layer; and patterning a first pad layer on the second pad layer. The lower connection electrode may be electrically connected to the at least one pad. The removing of the at least a portion of the unetched base layer may include exposing at least a portion of the second pad layer by performing a plasma etching process using nitrogen trifluoride gas. The second pad layer may include indium zinc oxide (IZO).

According to one or more embodiments, the plasma etching process may be a dry etching process using nitrogen trifluoride gas.

According to one or more embodiments, the second pad layer may be an etch stopper for the first pad layer in case that the plasma etching process is performed.

According to one or more embodiments, the removing of the at least a portion of the unetched base layer may include removing at least a portion of the barrier layer to expose at least a portion of a side surface of the first pad layer, and a side surface and a surface of the second pad layer.

According to one or more embodiments, the removing of the at least a portion of the unetched base layer may include removing at least a portion of the lower unetched base layer to provide a lower base layer having an open area. The open area may include a main open area and a sub-open area. The sub-open area may be adjacent to a side surface of the first pad layer and a side surface of the second pad layer.

According to one or more embodiments, the method may further include patterning a connection electrode on the at least one pad; and disposing a chip-on-film electrically connected to the connection electrode on a rear surface of the lower base layer.

According to one or more embodiments, the patterning of the first pad layer may include depositing the first pad layer having a thickness in a range of about 6,000 Å to about 9,000 Å, and the patterning of the second pad layer may include depositing the second pad layer having a thickness in a range of about 500 Å to about 700 Å.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
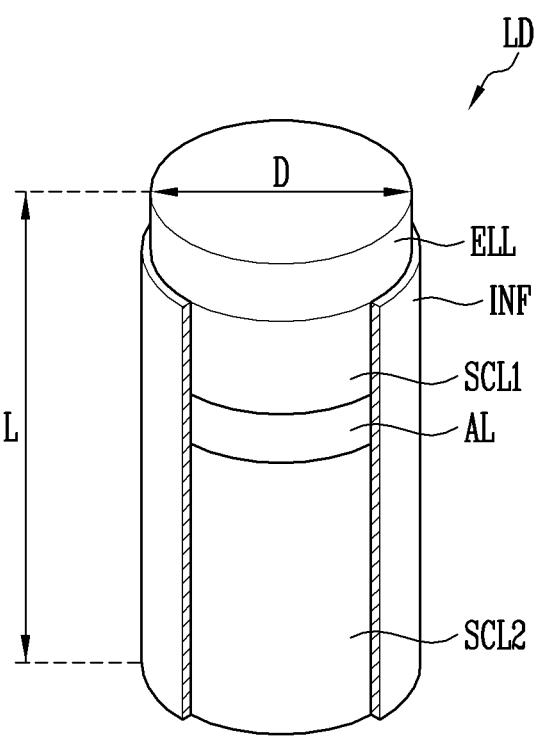
FIG. 1 is a perspective view schematically illustrating a light emitting element according to one or more embodiments.

As the disclosure allows for various changes and numerous embodiments, some embodiments will be illustrated in the drawings and described in detail in the written description. However, this is not intended to limit the disclosure to particular modes of practice, and it is to be appreciated that all changes, equivalents, and substitutes that do not depart from the features and technical scope of the disclosure are encompassed in the disclosure.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

Although the terms "first", "second", and the like may be used herein to describe various elements, these elements should not be limited by these terms. These terms are used to distinguish one element from another element. Thus, a first element discussed below could be termed a second element without departing from the scope of the disclosure. Similarly, the second element could also be termed the first element.

In the disclosure, the singular expressions are intended to include the plural expressions as well, unless the context clearly indicates otherwise.

It will be further understood that the terms "comprise", "include", "have", etc. used in the disclosure, specify the presence of stated features, integers, steps, operations, elements, components, or combinations of them but do not preclude the presence or addition of one or more other features, integers, steps, operations, elements, components, or combinations thereof. In addition, when a first part such as a layer, film, region, plate, etc. is "on" a second part, the first part may be not only "directly on" the second part but a third part may intervene between them. Furthermore, in the disclosure, when a first part such as a layer, film, region, plat, etc. is formed on a second part, a direction in which the first part is formed is not limited to an upper direction of the second part, but may include a side or a lower direction of the second part. To the contrary, when a first part such as a layer, film, region, plate, etc. is "under" a second part, the first part may be not only "directly under" the second part but a third part may intervene between them.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the disclosure. Further, the blocks, units, and/or modules of some embodiments may be physically combined into more complex blocks, units, and/or modules without departing from the scope of the disclosure.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

The disclosure relates to a display device. Hereinafter, detailed description of a display device and a method of manufacturing the same according to embodiments is provided below with reference to the accompanying drawings.

A display device DD (refer to FIG. 3) according to embodiments may include a light emitting element LD (e.g., refer to FIG. 1) configured to emit light. According to one or more embodiments, the light emitting element LD may be a self-light emitting element and may be an organic light emitting diode (OLED). In other embodiments, the light emitting element LD may be a micro light emitting diode including an inorganic material. The type of the light emitting element LD is not limited thereto. Hereinafter, for convenience of description, the light emitting element LD may be the micro light emitting diode including an inorganic material.

Figure 2:
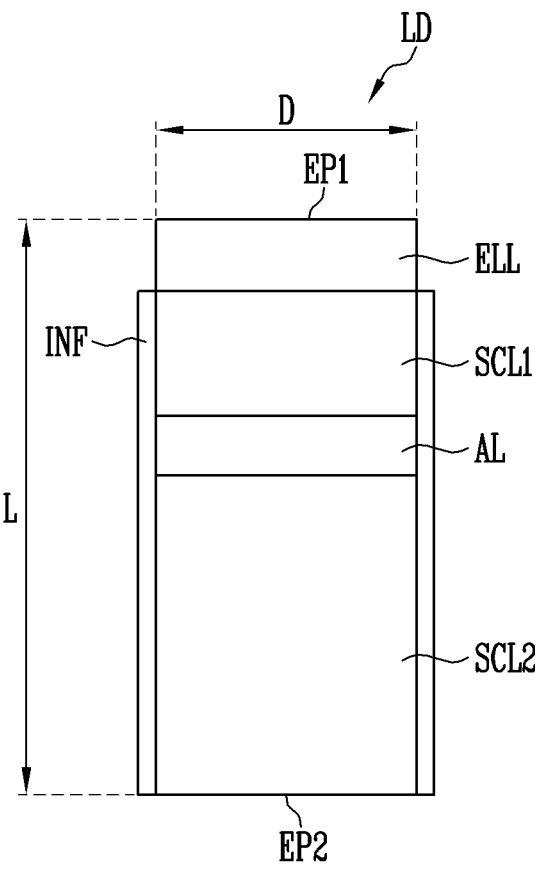
FIG. 2 is a cross-sectional view schematically illustrating the light emitting element according to one or more embodiments.

The light emitting element LD according to embodiments is described below with reference to FIGS. 1 and 2. FIG. 1 is a perspective view schematically illustrating a light emitting element according to one or more embodiments. FIG. 2 is a cross-sectional view schematically illustrating the light emitting element according to one or more embodiments.

Referring to FIGS. 1 and 2, the light emitting element LD may be configured to emit light. For example, the light emitting element LD may be a light emitting diode including an inorganic material.

The light emitting element LD may have various shapes. For example, the light emitting element LD may have a shape extending in a direction. In FIGS. 1 and 2, the light emitting element LD may have a columnar shape. However, the type and shape of the light emitting element LD are not limited to the above-described examples.

The light emitting element LD may include a first semiconductor layer SCL1, a second semiconductor layer SCL2, and an active layer AL disposed between the first and second semiconductor layers SCL1 and SCL2. For example, the extending direction of the light emitting element LD may be referred to as a length L direction, and the first semiconductor layer SCL1, the active layer AL, and the second semiconductor layer SCL2 of the light emitting element LD may be sequentially stacked in the length L direction. The light emitting element LD may further include an electrode layer ELL and an element insulating film INF.

The light emitting element LD may be provided in the columnar shape extending in the direction. The light emitting element LD may have a first end EP1 and a second end EP2. The first semiconductor layer SCL1 may be adjacent to the first end EP1 of the light emitting element LD, and the second semiconductor layer SCL2 may be adjacent to the second end EP2 of the light emitting element LD. The electrode layer ELL may be adjacent to the first end EP1.

The light emitting element LD may be a light emitting element manufactured in the columnar shape through an etching process. The columnar shape may include a rod-like shape or a bar-like shape, which is elongated in the length L direction (e.g., having an aspect ratio equal to or greater than about 1) For example, the columnar shape may have a cylinder or polygonal column (or prism shape). However, the shape of the cross-section thereof is not limited thereto. For example, a length L of the light emitting element LD may be greater than a diameter D (or a width of the cross-section) thereof.

The light emitting element LD may have a size of nano-meter scale to micro-meter scale. For example, the light emitting element LD may have the diameter D (or the width) and/or the length L in a range of nano-meter scale to micro-meter scale. However, the size of the light emitting element LD is not limited thereto.

The first semiconductor layer SCL1 may be a semiconductor layer of a first conductivity type. The first semiconductor layer SCL1 may be disposed on the active layer AL and may include a semiconductor layer of a different type from that of the second semiconductor layer SCL2. For example, the first semiconductor layer SCL1 may include a P-type semiconductor layer. For example, the first semiconductor layer SCL1 may include a P-type semiconductor layer including at least one semiconductor material of InAlGaN, GaN, AlGaN, InGaN, AlN, and InN, which is doped with a first conductivity type dopant such as Mg or the like. However, the material constituting the first semiconductor layer SCL1 is not limited thereto, and various other materials may be used to form the first semiconductor layer SCL1.

The active layer AL may be disposed between the first semiconductor layer SCL1 and the second semiconductor layer SCL2, and may have a single-quantum well structure or a multi-quantum well structure. The position of the active layer AL is not limited thereto, and may be variously changed according to the type of the light emitting element LD.

A clad layer doped with a conductive dopant may be formed on an upper portion and/or a lower portion of the active layer AL. For example, the clad layer may be formed of an AlGaN layer or an InAlGaN layer. According to one or more embodiments, a material such as AlGaN, InAlGaN, or the like may be used to form the active layer AL, and various other materials may be used to form the active layer AL.

The second semiconductor layer SCL2 may be a semiconductor layer of a second conductivity type. The second semiconductor layer SCL2 may be disposed on the active layer AL and may include a semiconductor layer of a different type from that of the first semiconductor layer SCL1. For example, the second semiconductor layer SCL2 may include an N-type semiconductor layer. For example, the second semiconductor layer SCL2 may include an N-type semiconductor layer including at least one semiconductor material of InAlGaN, GaN, AlGaN, InGaN, AlN, and InN, which is doped with a second conductivity type dopant such as Si, Ge, Sn, or the like. However, the material constituting the second semiconductor layer SCL2 is not limited thereto, and various other materials may be used to form the second semiconductor layer SCL2.

In case that a voltage equal to or greater than a threshold voltage is applied to both ends (e.g., the first end EP1 and the second end EP2) of the light emitting element LD, electron-hole pairs may be combined in the active layer AL, and the light emitting element LD may emit the light. The light emitting of the light emitting element LD may be controlled using the principle (or the combination of the electron-hole pairs), the light emitting element LD may be used as a light source of various light emitting devices including pixels of a display device.

The element insulating film INF may be disposed on a surface (e.g., a side surface or an outer surface) of the light emitting element LD. The element insulating film INF may be formed on the surface of the light emitting element LD and may be adjacent to the outer surface (e.g., surround at least the outer surface) of the active layer AL. For example, the element insulating film INF may further surround a region (or regions) of the first and second semiconductor layers SCL1 and SCL2. The element insulating film INF may be formed of a single layer or a double layer, but the disclosure is not limited thereto, and may include multiple films. For example, the element insulating film INF may include a first insulating film including a first material and a second insulating film including a second material different from the first material. For example, the second insulating film of the element insulating film INF may be disposed on the first insulating film.

The element insulating film INF may expose both ends (e.g., the first end EP1 and the second end EP2) of the light emitting element LD having different polarities. For example, the element insulating film INF may expose an end of each of the electrode layer ELL and the second semiconductor layer SCL2 adjacent to the first and second ends EP1 and EP2 of the light emitting element LD. For example, the element insulating film INF may expose the first end EP1, the second end EP2, and an outer surface (or a portion of the outer surface) of the electrode layer ELL. In other embodiments, the element insulating film INF may expose the first end EP1, the second end EP2, the outer surface (or a portion of the outer surface) of the electrode layer ELL, and at least a portion of the second semiconductor layer SCL2.

The element insulating film INF may include at least one insulating material of silicon oxide (SiOx), silicon nitride (SiNx), silicon oxynitride (SiOxNy), aluminum oxide (AlOx), and titanium oxide (TiOx). The element insulating film INF may have a single-layer or multi-layer structure. However, the disclosure is not limited to the above-described examples. For example, according to another embodiment, the element insulating film INF may be omitted.

According to one or more embodiments, the element insulating film INF may cover the surface of the light emitting element LD (e.g., the outer surface of the active layer AL). Thus, electrical stability of the light emitting element LD may be secured. For example, the element insulating film INF may be provided on the surface of the light emitting element LD, surface defects of the light emitting element LD may be minimized (or prevented), and lifespan and efficiency of the light emitting element LD may be improved. Even in case that multiple light emitting elements LD are disposed adjacent to each other, an unwanted short circuit between the light emitting elements LD may be prevented.

The electrode layer ELL may be disposed on the first semiconductor layer SCL1. The electrode layer ELL may be adjacent to the first end EP1. The electrode layer ELL may be electrically connected to the first semiconductor layer SCL1.

A portion of the electrode layer ELL may be exposed. For example, the element insulating film INF may expose a surface of the electrode layer ELL. The electrode layer ELL may be exposed in a region corresponding to the first end EP1.

According to one or more embodiments, a side surface (or the outer surface) of the electrode layer ELL may be exposed. For example, the element insulating film INF may cover side surfaces (or outer surfaces) of the first semiconductor layer SCL1, the active layer AL, and the second semiconductor layer SCL2, but may not cover at least a portion of the side surface of the electrode layer ELL. Other components of the electrode layer ELL adjacent to the first end EP1 may be readily and electrically connected to other elements. According to one or more embodiments, the element insulating film INF may expose the side surface of the electrode layer ELL, and may further expose a portion of the side surface of the first semiconductor layer SCL1 and/or a portion of the second semiconductor layer SCL2.

According to one or more embodiments, the electrode layer ELL may be an ohmic contact electrode. However, the disclosure is not limited to the above-described examples. For example, the electrode layer ELL may be a Schottky contact electrode.

According to one or more embodiments, the electrode layer ELL may include at least one of chromium (Cr), titanium (Ti), aluminum (Al), gold (Au), nickel (Ni), an oxide thereof, and an alloy thereof. However, the disclosure is not limited to the above-described examples. According to one or more embodiments, the electrode layer ELL may be substantially transparent. For example, the electrode layer ELL may include indium tin oxide (ITO). Accordingly, the emitted light may pass through the electrode layer ELL.

The structure and shape of the light emitting element LD are not limited to the above-described examples. According to embodiments, the light emitting element LD may have various structures and shapes. For example, the light emitting element LD may further include an additional electrode layer disposed on a surface (e.g., the side surface or the outer surface) of the second semiconductor layer SCL2 and adjacent to the second end EP2.

Figure 3:
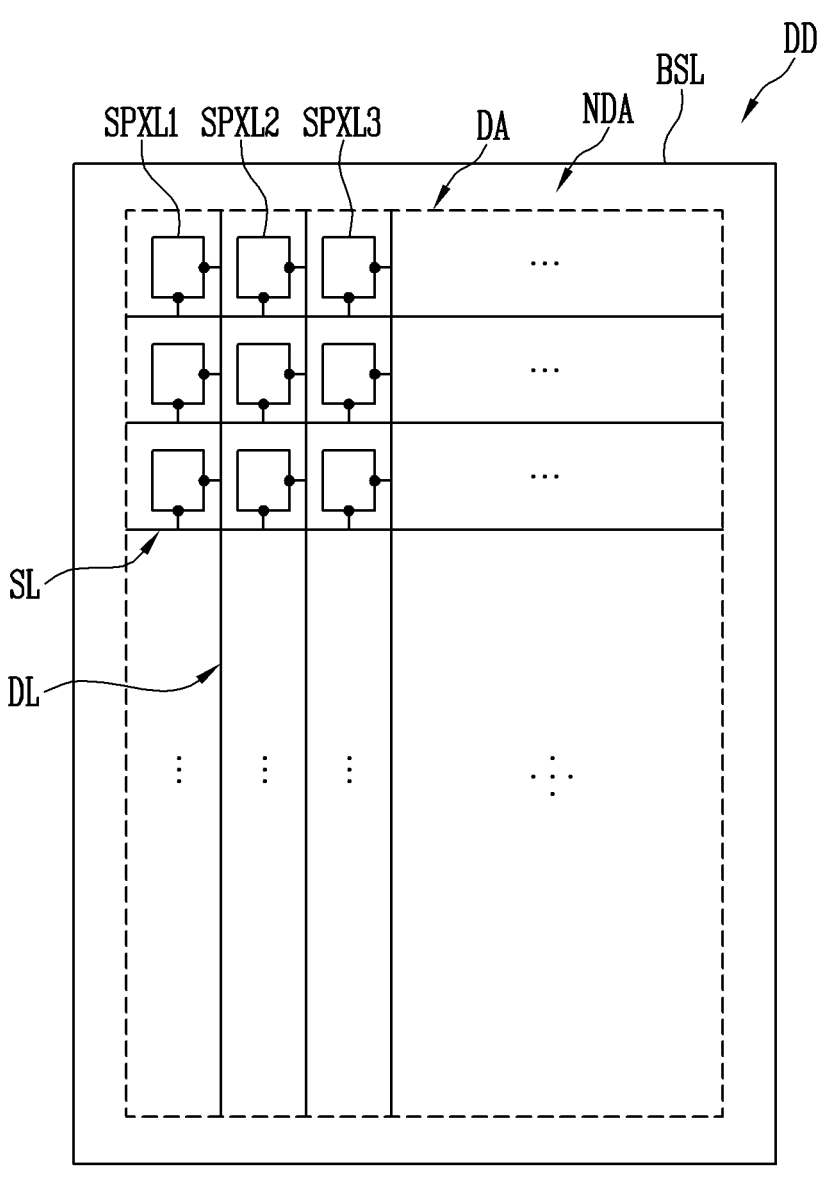
FIGS. 3 and 4 are plan views schematically illustrating a display device according to one or more embodiments.
Figure 3:
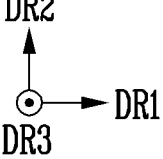
Figure 4:
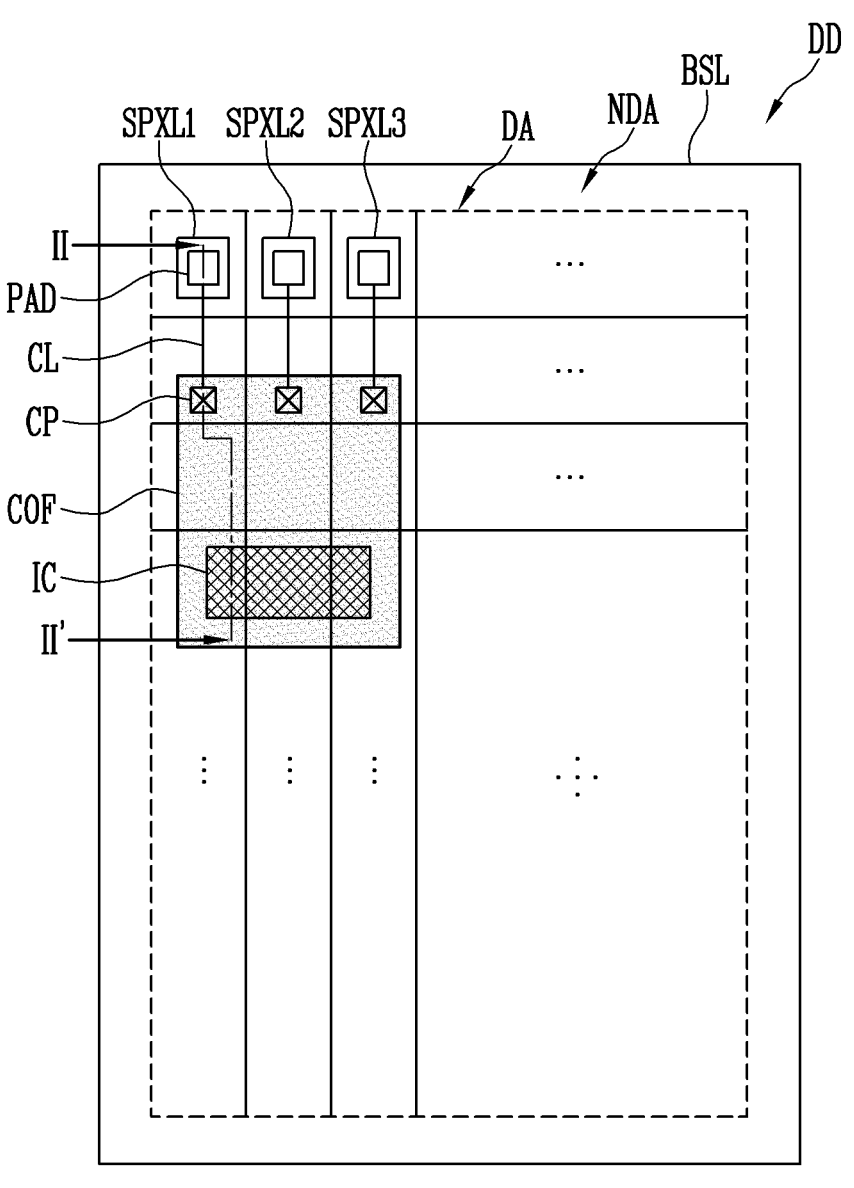
Figure 4:
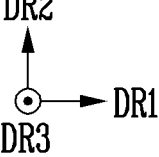

FIGS. 3 and 4 are plan views schematically illustrating a display device according to one or more embodiments. Referring to FIGS. 3 and 4, the display device DD may include a base layer BSL and a pixel PXL (or sub-pixels SPXL) disposed on the base layer BSL. The display device DD may further include a driving circuit part (e.g., a scan driver and a data driver) for driving the pixel PXL, scan lines SL, data lines DL, wirings, and pads PAD. The display device DD may further include a chip-on-film COF, a driving chip IC, a connection portion CP, and a connection line CL.

The display device DD may include a display area DA and a non-display area NDA. The non-display area NDA may refer to an area other than the display area DA. The non-display area NDA may be adjacent to (e.g., surround at least a portion of) the display area DA.

The base layer BSL may form (or be implemented with) a base member of the display device DD. The base layer BSL may be a rigid or flexible substrate (or film). For example, the base layer BSL may include at least one of a rigid substrate made of glass or tempered glass, a flexible substrate (or thin film) made of plastic or metal, and an insulating layer. According to embodiments, the material and/or properties of the base layer BSL are not limited thereto. According to one or more embodiments, the base layer BSL may be substantially transparent. The term "substantially transparent" may mean that light may be transmitted with a transmittance (e.g., a predetermined or selectable transmittance) or more. In another embodiment, the base layer BSL may be translucent or opaque. Also, the base layer BSL may include a reflective material according to one or more embodiments.

According to one or more embodiments, the base layer BSL may include multiple layers. For example, the base layer BSL may include a first base layer (or upper base layer) 120, barrier layers 140, and a second base layer (or lower base layer) 160 (e.g., refer to FIG. 8). A detailed structure of the base layer BSL is described below.

The display area DA may refer to an area in which the pixel PXL (e.g., the sub-pixels SPXL or the light emitting elements LD) is disposed. The non-display area NDA may refer to an area in which the pixel PXL is not disposed.

According to an example, pixels PXL may be arranged according to a stripe or PENTILE™ arrangement structure. However, the disclosure is not limited thereto, and various embodiments may be applied to the disclosure.

According to one or more embodiments, the pixel PXL may include a first sub-pixel SPXL1, a second sub-pixel SPXL2, and a third sub-pixel SPXL3. Each of the first sub-pixel SPXL1, the second sub-pixel SPXL2, and the third sub-pixel SPXL3 may be a sub-pixel. The first sub-pixel SPXL1, the second sub-pixel SPXL2, and the third sub-pixel SPXL3 may form a pixel part capable of emitting light of various colors. In the disclosure, "sub-pixel SPXL" may mean one or more of the first to third sub-pixels SPXL1, SPXL2, and SPXL3.

Each of the first sub-pixel SPXL1, the second sub-pixel SPXL2, and the third sub-pixel SPXL3 may emit light of a color. For example, the first sub-pixel SPXL1 may be a red pixel emitting red (e.g., a first color) light, the second sub-pixel SPXL2 may be a green pixel emitting green (e.g., a second color) light, and the third sub-pixel SPXL3 may be a blue pixel emitting blue (e.g., a third color) light. According to one or more embodiments, the number of second sub-pixels SPXL2 may be greater than the number of first sub-pixels SPXL1 and/or the number of third sub-pixels SPXL3. However, the color, type, and/or number of the first sub-pixels SPXL1, the second sub-pixels SPXL2, and the third sub-pixels SPXL3 constituting the pixel part are not limited thereto.

The scan lines SL may be electrically connected to the scan driver disposed on a side (e.g., in the non-display area NDA) of the display area DA. For example, the scan driver may be disposed in a portion of the non-display area NDA adjacent to the display area DA in a first direction DR1. However, the position of the scan driver is not limited to the above-described example. According to one or more embodiments, the scan driver may be included in the driving chip IC or may be separately provided in the chip-on-film COF. Detailed description of the driving chip IC is provided below. The scan lines SL may extend along a pixel row. For example, the scan lines SL may extend in the first direction DR1 and may be spaced apart from each other in a second direction DR2. Each of the scan lines SL may be electrically connected to each of the pixels PXL (or sub-pixels SPXL).

The data lines DL may be electrically connected to the data driver included in the driving chip IC. According to one or more embodiments, one or more data drivers may be included in each driving chip IC. The data lines DL may extend along a pixel column. For example, the data lines DL may extend in the second direction DR2 and may be spaced apart from each other in the first direction DR1. Each of the data lines DL may be electrically connected to each of the pixels PXL (or sub-pixels SPXL).

Pads PAD may be provided (e.g., provided on the base layer BSL). One or more pads PAD may be disposed to correspond to each of the sub-pixels SPXL. The pads PAD may be electrically connected to the chip-on-film COF and the driving chip IC through the connection line CL and the connection portion CP. For example, a data signal acquired (or output) by the data driver in the driving chip IC may be provided (or applied) to each of the pads PAD through the chip-on-film COF, the connection portion CP, and the connection line CL. The data signal provided to the pads PAD may be provided (or applied) to the data lines DL electrically connected to the pads PAD, and a data signal may be supplied to each of the sub-pixels SPXL.

According to one or more embodiments, the pads PAD may overlap the display area DA in a plan view. For example, the pads PAD may overlap an area in which the pixels PXL are disposed (or defined) in a plan view.

The chip-on-film COF may provide (or form) a region in which the driving chip IC is disposed. The chip-on-film COF may be electrically connected to the pads PAD through the connection portion CP and the connection line CL, and may be electrically connected to the driving chip IC. Accordingly, an electrical signal provided by the driving chip IC may be supplied to the pixel PXL through the chip-on-film COF.

The number of the chip-on-film COF is not limited thereto. For example, the number of the chip-on-film COF may be one or two or more. At least a portion of the chip-on-film COF may be disposed in the display area DA. The chip-on-film COF may be positioned in the display area DA. The chip-on-film COF may overlap the display area DA in a plan view. For example, the chip-on-film COF may be disposed on a rear surface of the base layer BSL in the display area DA of the display device DD. In case that the chip-on-film COF and the driving chip IC are disposed on the base layer BSL, a large-area display device DD may be readily manufactured or the non-display area NDA (e.g., a dead space) may be readily minimized. For example, when manufacturing a tiled display device for forming a large-area display surface, the above-described structure may be applied. For example, the display device DD may include display devices having structures corresponding to each other and connected adjacent to each other. However, examples to which the above-described structure is applied are not limited thereto.

According to one or more embodiments, the chip-on-film COF may include an insulating film and wirings provided on the insulating film. The chip-on-film COF may refer to a form in which wirings are formed on an insulating film made of a thin film, and may also be referred to as a tape carrier package, a flexible printed circuit, board, or the like.

The driving chip IC may be disposed in the display area DA. The position of the driving chip IC may correspond to at least a portion of the chip-on-film COF. The driving chip IC may overlap the display area DA in a plan view. The driving chip IC may be disposed on the rear surface of the base layer BSL. As described above, a large-area display device DD may be readily manufactured and the non-display area NDA may be minimized.

The driving chip IC may include the data driver. The driving chip IC may output the data signal to each data line DL. According to one or more embodiments, the driving chip IC may be disposed on the chip-on-film COF. According to one or more embodiments, the driving chip IC may be mounted on the insulating film of the chip-on-film COF, and may be electrically connected to at least some of the wirings.

Figure 5:
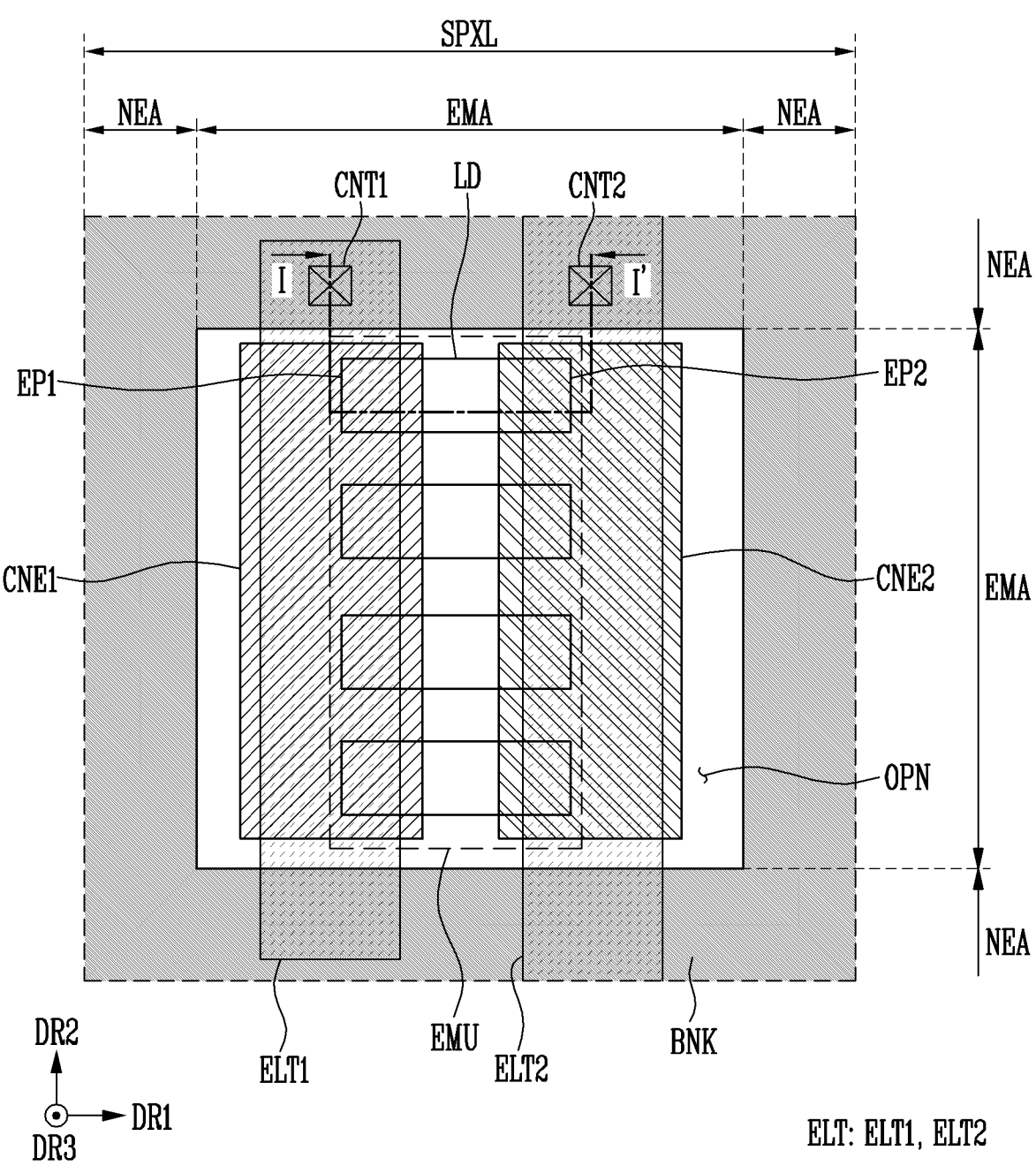
FIG. 5 is a plan view schematically illustrating a sub-pixel according to one or more embodiments.
Figure 6:
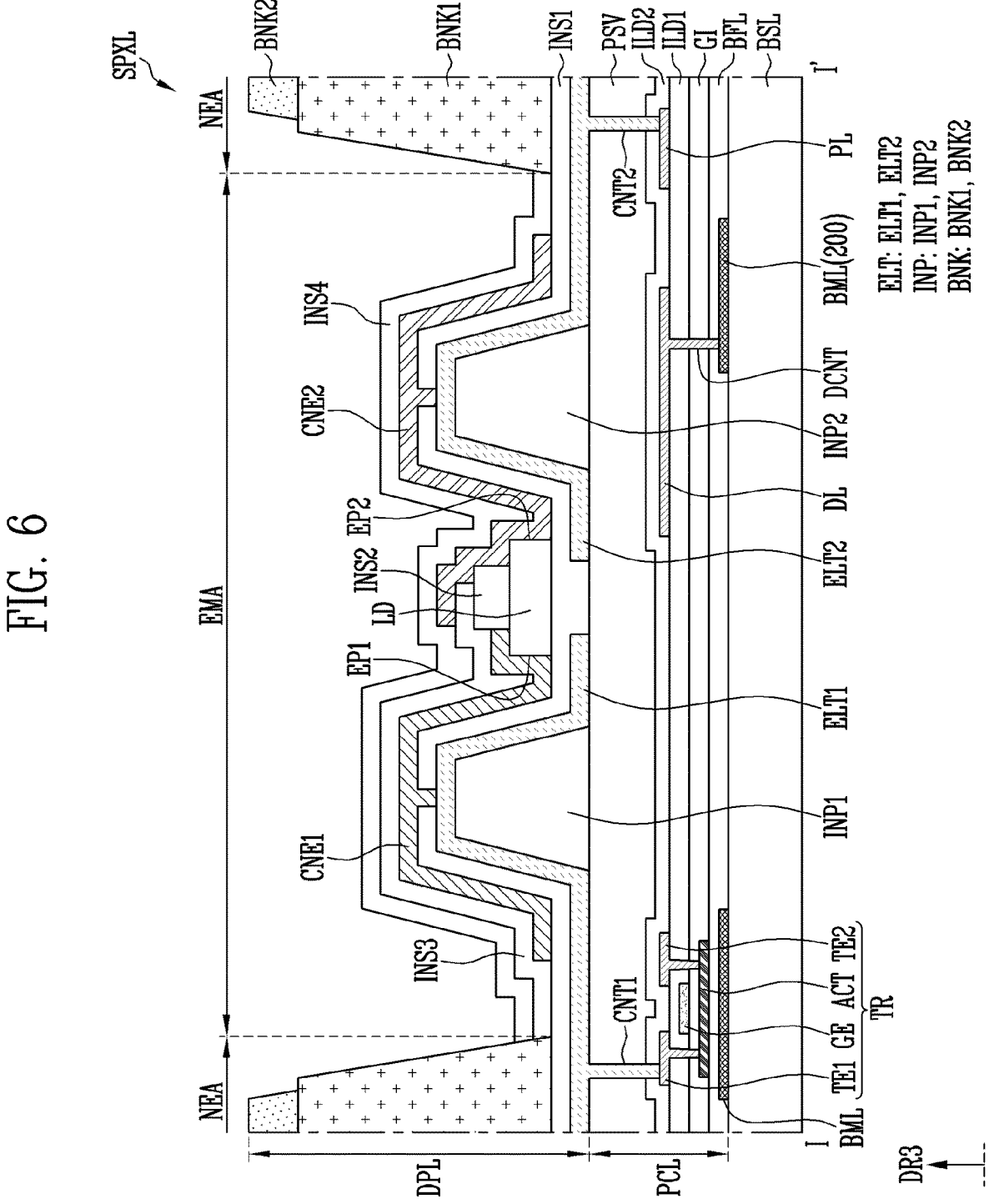
FIG. 6 is a cross-sectional view schematically illustrating the sub-pixel according to one or more embodiments.
Figure 7:
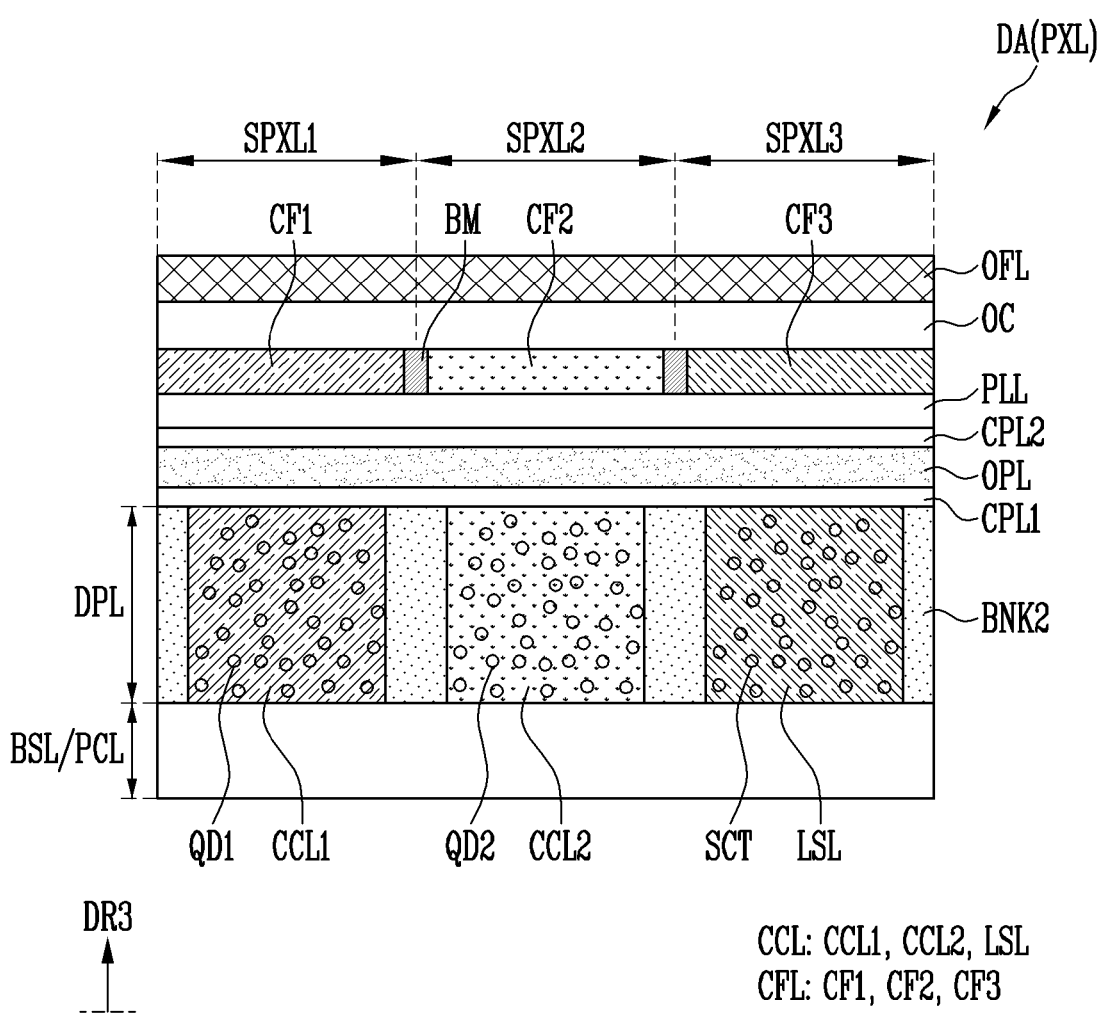
FIG. 7 is a cross-sectional view schematically illustrating a pixel according to one or more embodiments.

Hereinafter, a structure of the pixel PXL (or sub-pixel SPXL) according to one or more embodiments is described below with reference to FIGS. 5 to 7. FIGS. 5 to 7 are diagrams illustrating the pixel PXL (or sub-pixel SPXL) according to one or more embodiments. Detailed description of the same constituent elements is briefly described or omitted.

A planar structure of the sub-pixel SPXL is described below with reference to FIG. 5. FIG. 5 is a plan view schematically illustrating a sub-pixel according to one or more embodiments. The sub-pixel SPXL shown in FIG. 5 may be one of the first to third sub-pixels SPXL1, SPXL2, and SPXL3 described above with reference to FIGS. 3 and 4.

The sub-pixel SPXL may include an emission area EMA and a non-emission area NEA. The sub-pixel SPXL may include a bank BNK, an alignment electrode ELT, the light emitting element LD, a first contact electrode CNE1, and a second contact electrode CNE2.

The emission area EMA may overlap an opening OPN defined by the bank BNK in a plan view. The light emitting elements LD may be disposed in the emission area EMA.

The light emitting elements LD may not be disposed in the non-emission area NEA. A portion of the non-emission area NEA may overlap the bank BNK in a plan view.

The bank BNK may form (or provide) the opening OPN. For example, the bank BNK may have a shape that protrudes in a thickness direction (e.g., a third direction DR3) of the base layer BSL and may be adjacent to an area thereof (e.g., surround a predetermined or selectable area). Accordingly, the opening OPN in which the bank BNK is not disposed may be formed.

The bank BNK may form a space. The bank BNK may have a shape adjacent to (e.g., surrounding) a partial area in a plan view. The space of the bank BNK may mean an area in which a fluid may be accommodated. According to one or more embodiments, the bank BNK may include a first bank BNK1 and a second bank BNK2 (e.g., refer to FIG. 6).

According to one or more embodiments, ink including the light emitting element LD may be provided in the space defined by the bank BNK (e.g., the first bank BNK1), and the light emitting element LD may be disposed in the opening OPN.

According to one or more embodiments, a color conversion layer CCL (e.g., refer to FIG. 7) may be disposed (or patterned) in the space defined by the bank BNK (e.g., the second bank BNK2).

The bank BNK may define the emission area EMA and the non-emission area NEA. The bank BNK may be adjacent to (e.g., surround at least a portion of) the emission area EMA in a plan view. For example, an area in which the bank BNK is disposed may be the non-emission area NEA. An area in which the bank BNK is not disposed, and the area in which the light emitting element LD is disposed may be the emission area EMA.

The alignment electrode ELT may be an electrode for aligning the light emitting element LD. According to one or more embodiments, the alignment electrode ELT may include a first electrode ELT1 and a second electrode ELT2. The alignment electrode ELT may be referred to as "electrode" or "electrodes".

The alignment electrode ELT may have a single-layered or multi-layered structure. For example, the alignment electrode ELT may include at least one reflective electrode layer including a reflective conductive material. In other embodiments, the alignment electrode ELT may further include at least one transparent electrode layer and/or a conductive capping layer. According to one or more embodiments, the alignment electrode ELT may include at least one of silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. However, the disclosure is not limited to the above-described examples, and the alignment electrode ELT may include one of various materials having reflectivity. However, the disclosure is not limited to the above-described examples.

The light emitting element LD may be disposed on the alignment electrode ELT. According to one or more embodiments, at least a portion of the light emitting element LD may be disposed between the first electrode ELT1 and the second electrode ELT2. The light emitting element LD may be aligned between the first electrode ELT1 and the second electrode ELT2. The light emitting elements LD may form (or configure) an emission part EMU. The emission part EMU may refer to a part including light emitting elements LD adjacent to each other.

According to one or more embodiments, the light emitting element LD may be aligned in various ways. For example, FIG. 5 shows one or more embodiments in which the light emitting elements LD are arranged in parallel between the first electrode ELT1 and the second electrode ELT2. However, the disclosure is not limited to the above-described examples. For example, the light emitting elements LD may be arranged in a series structure or a series/parallel mixed structure, and the number of parts (e.g., emission parts EMU) electrically connected in series and/or in parallel is not limited thereto.

The first electrode ELT1 and the second electrode ELT2 may be spaced apart from each other. For example, the first electrode ELT1 and the second electrode ELT2 may be spaced apart from each other in the first direction DR1 in the emission area EMA and may extend in the second direction DR2.

According to one or more embodiments, the first electrode ELT1 and the second electrode ELT2 may be electrodes for aligning the light emitting elements LD. The first electrode ELT1 may be a first alignment electrode, and the second electrode ELT2 may be a second alignment electrode.

The first electrode ELT1 and the second electrode ELT2 may receive a first alignment signal and a second alignment signal, respectively, in a process of aligning the light emitting elements LD. For example, the ink including the light emitting element LD may be supplied (or provided) to the opening OPN defined by the bank BNK (e.g., the first bank BNK1). The first alignment signal may be supplied to the first electrode ELT1, and the second alignment signal may be supplied to the second electrode ELT2. The first alignment signal and the second alignment signal may have different waveforms, potentials, and/or phases. For example, the first alignment signal may be an AC signal, and the second alignment signal may be a ground signal (or ground potential). However, the disclosure is not limited to the above-described examples. An electric field may be formed between (or on) the first electrode ELT1 and the second electrode ELT2, and the light emitting elements LD may be aligned between the first electrode ELT1 and the second electrode ELT2 based on the electric field. For example, the light emitting elements LD may be moved (or rotated) by a force (e.g., a dielectrophoresis (DEP) force) according to the electric field and aligned (or disposed) on the alignment electrode ELT.

The first electrode ELT1 may be electrically connected to a circuit element (e.g., a transistor TR of FIG. 6) through a first contact member CNT1. According to one or more embodiments, the first electrode ELT1 may provide an anode signal, and the light emitting element LD may emit light. The first electrode ELT1 may provide the first alignment signal for aligning the light emitting element LD.

The second electrode ELT2 may be electrically connected to a power source line PL (e.g., refer to FIG. 6) through a second contact member CNT2. According to one or more embodiments, the second electrode ELT2 may provide a cathode signal, and the light emitting element LD may emit light. The second electrode ELT2 may provide the second alignment signal for aligning the light emitting element LD.

The positions of the first contact member CNT1 and the second contact member CNT2 are not limited to the positions shown in FIG. 5 and may be appropriately changed in various ways.

The light emitting element LD may emit light based on the provided electrical signal. For example, the light emitting element LD may provide light based on a first electrical signal (e.g., the anode signal) provided from the first contact electrode CNE1 and a second electrical signal (e.g., the cathode signal) provided from the second contact electrode CNE2.

The first end EP1 of the light emitting element LD may be disposed adjacent to the first electrode ELT1, and the second end EP2 of the light emitting element LD may be disposed adjacent to the second electrode ELT2. The first end EP1 may or may not overlap the first electrode ELT1 (e.g., in a plan view). The second end EP2 may or may not overlap the second electrode ELT2.

According to one or more embodiments, the first end EP1 of each of the light emitting elements LD may be electrically connected to the first electrode ELT1 through the first contact electrode CNE1. In another embodiment, the first end EP1 of each of the light emitting elements LD may be electrically connected (e.g., directly connected) to the first electrode ELT1. In another embodiment, the first end EP1 of each of the light emitting elements LD may be electrically connected to only the first contact electrode CNE1 and may not be electrically connected to the first electrode ELT1.

The second end EP2 of each of the light emitting elements LD may be electrically connected to the second electrode ELT2 through the second contact electrode CNE2. In another embodiment, the second end EP2 of each of the light emitting elements LD may be electrically connected (e.g., directly connected) to the second electrode ELT2. In another embodiment, the second end EP2 of each of the light emitting elements LD may be electrically connected to only the second contact electrode CNE2 and may not be electrically connected to the second electrode ELT2.

The first contact electrode CNE1 and the second contact electrode CNE2 may be disposed on first ends EP1 and second ends EP2 of the light emitting elements LD, respectively. For example, the first contact electrode CNE1 may be disposed on the first ends EP1 of the light emitting elements LD, and the second contact electrode CNE2 may be disposed on the second ends EP2 of the light emitting elements LD.

The first contact electrode CNE1 may be disposed on the first ends EP1 and electrically connected to the first ends EP1 of the light emitting elements LD. In one or more embodiments, the first contact electrode CNE1 may be disposed on the first electrode ELT1 and electrically connected to the first electrode ELT1. The first ends EP1 of the light emitting elements LD may be electrically connected to the first electrode ELT1 through the first contact electrode CNE1.

The second contact electrode CNE2 may be disposed on the second ends EP2 and electrically connected to the second ends EP2 of the light emitting elements LD. In one or more embodiments, the second contact electrode CNE2 may be disposed on the second electrode ELT2 and electrically connected to the second electrode ELT2. The second ends EP2 of the light emitting elements LD may be electrically connected to the second electrode ELT2 through the second contact electrode CNE2.

A cross-sectional structure of the pixel PXL (or sub-pixel SPXL) according to one or more embodiments is described below with reference to FIGS. 6 and 7. For example, detailed description of a pixel circuit layer PCL and a display element layer DPL of the sub-pixel SPXL is provided below with reference to FIG. 6. Detailed description of an optical layer OPL, a color filter layer CFL, and an outer film layer OFL is provided below with reference to FIG. 7. Detailed description of the same constituent elements is briefly described or omitted.

FIG. 6 is a cross-sectional view schematically illustrating the sub-pixel according to one or more embodiments. FIG. 7 is a cross-sectional view schematically illustrating a pixel according to one or more embodiments. Referring to FIG. 6, the sub-pixel SPXL may be disposed on the base layer BSL. The sub-pixel SPXL may include the pixel circuit layer PCL and the display element layer DPL.

The base layer BSL may form (or be implemented with) a base member on which the sub-pixel SPXL is to be formed. The base layer BSL may provide an area in which the pixel circuit layer PCL and the display element layer DPL are disposed.

The pixel circuit layer PCL may be disposed on the base layer BSL. The pixel circuit layer PCL may include a lower auxiliary electrode BML, a buffer layer BFL, the transistor TR, a gate insulating layer GI, a first interlayer insulating layer ILD1, the power source line PL, the data lines DL, a second interlayer insulating layer ILD2, and a passivation layer PSV.

The lower auxiliary electrode BML may be disposed on the base layer BSL. The lower auxiliary electrode BML may function as a path through which an electrical signal is transmitted. According to one or more embodiments, a portion of the lower auxiliary electrode BML may overlap the transistor TR in a plan view.

The lower auxiliary electrode BML may include a lower connection electrode 200. The lower connection electrode 200 may be covered by the buffer layer BFL. The lower connection electrode 200 may function as a path through which the data signal is transmitted. For example, the lower connection electrode 200 may be electrically connected to the pads PAD (e.g., refer to FIG. 9) to receive the data signal, and may be electrically connected to the data line DL through a data contact member DCNT penetrating the layers of the pixel circuit layer PCL (e.g., the buffer layer BFL, the gate insulating layer GI, and the first interlayer insulating layer ILD1).

The buffer layer BFL may be disposed on the base layer BSL. The buffer layer BFL may cover the lower auxiliary electrode BML. The buffer layer BFL may prevent impurities from diffusing toward the sub-pixel SPXL from outside thereof. The buffer layer BFL may include at least one of silicon oxide (SiOx), silicon nitride (SiNx), silicon oxynitride (SiOxNy), aluminum oxide (AlOx), and titanium oxide (TiOx). However, the disclosure is not limited to the above-described examples.

The transistor TR may be a thin film transistor. According to one or more embodiments, the transistor TR may be a driving transistor. The transistor TR may be electrically connected to the light emitting element LD. The transistor TR may be electrically connected to the first end EP1 of the light emitting element LD.

The transistor TR may include an active layer ACT, a first transistor electrode TE1, a second transistor electrode TE2, and a gate electrode GE.

The active layer ACT may refer to a semiconductor layer. The active layer ACT may be disposed on the buffer layer BFL. The active layer ACT may include at least one selected from the group consisting of polysilicon, low temperature polycrystalline silicon (LTPS), amorphous silicon, and an oxide semiconductor.

The active layer ACT may include a first contact region in contact with the first transistor electrode TE1 and a second contact region in contact with the second transistor electrode TE2. The first contact region and the second contact region may be semiconductor patterns doped with impurities. A region between the first contact region and the second contact region may be a channel region. The channel region may be an intrinsic semiconductor pattern not doped with impurities.

The gate electrode GE may be disposed on the gate insulating layer GI. The position of the gate electrode GE may correspond to the position of the channel region of the active layer ACT. For example, the gate electrode GE may be disposed on the channel region of the active layer ACT with the gate insulating layer GI disposed therebetween. For example, the gate insulating layer GI is disposed between the channel region and the gate electrode GE.

The gate insulating layer GI may be disposed on the buffer layer BFL. The gate insulating layer GI may cover the active layer ACT. The gate insulating layer GI may include at least one of silicon oxide (SiOx), silicon nitride (SiNx), silicon oxynitride (SiOxNy), aluminum oxide (AlOx), and titanium oxide (TiOx). However, the disclosure is not limited to the above-described examples.

The first interlayer insulating layer ILD1 may be disposed on the gate insulating layer GI. The first interlayer insulating layer ILD1 may cover the gate electrode GE. The first interlayer insulating layer ILD1 may include at least one of silicon oxide (SiOx), silicon nitride (SiNx), silicon oxynitride (SiOxNy), aluminum oxide (AlOx), and titanium oxide (TiOx). However, the disclosure is not limited to the above-described examples.

The first transistor electrode TE1 and the second transistor electrode TE2 may be disposed on the first interlayer insulating layer ILD1. The first transistor electrode TE1 may pass through the gate insulating layer GI and the first interlayer insulating layer ILD1 to contact the first contact region of the active layer ACT. The second transistor electrode TE2 may pass through the gate insulating layer GI and the first interlayer insulating layer ILD1 to contact the second contact region of the active layer ACT. For example, the first transistor electrode TE1 may be a drain electrode and the second transistor electrode TE2 may be a source electrode, but the disclosure is not limited thereto.

The first transistor electrode TE1 may be electrically connected to the first electrode ELT1 through the first contact member CNT1 penetrating the passivation layer PSV and the second interlayer insulating layer ILD2.

The power source line PL may be disposed on the first interlayer insulating layer ILD1. According to one or more embodiments, the power source line PL, the data lines DL, the first transistor electrode TE1, and the second transistor electrode TE2 may be disposed on a same layer (e.g., the first interlayer insulating layer ILD1). The power source line PL may be electrically connected to the second electrode ELT2 through the second contact member CNT2. The power source line PL may supply a power source or an alignment signal through the second electrode ELT2.

The data lines DL may be disposed on the first interlayer insulating layer ILD1. According to one or more embodiments, the data lines DL, the power source line PL, the first transistor electrode TE1, and the second transistor electrode TE2 may be disposed on a same layer (e.g., the first interlayer insulating layer ILD1). The data lines DL may be electrically connected to the lower connection electrode 200 through the data contact member DCNT. The data lines DL may receive the data signal through the lower connection electrode 200.

The second interlayer insulating layer ILD2 may be disposed on the first interlayer insulating layer ILD1. The second interlayer insulating layer ILD2 may cover the first transistor electrode TE1, the second transistor electrode TE2, the data lines DL, and the power source line PL. The second interlayer insulating layer ILD2 may include at least one of silicon oxide (SiOx), silicon nitride (SiNx), silicon oxynitride (SiOxNy), aluminum oxide (AlOx), and titanium oxide (TiOx). However, the disclosure is not limited to the above-described examples.

The passivation layer PSV may be disposed on the second interlayer insulating layer ILD2. According to one or more embodiments, the passivation layer PSV may be a via layer. The passivation layer PSV may include an organic material to planarize a lower step difference (e.g., step difference formed by the data lines DL, the power source line PL, the first transistor electrode TE1, and the second transistor electrode TE2). The step difference may be a height difference or thickness difference. For example, the passivation layer PSV may include at least one organic material of an acrylates resin, an epoxy resin, a phenolic resin, a polyamides resin, a polyimides resin, a polyester resin, a polyphenylenesulfides resin, and benzocyclobutene (BCB). However, the disclosure is not limited thereto, and the passivation layer PSV may include various kinds of inorganic materials including at least one of silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), and titanium oxide (TiOx).

According to one or more embodiments, the sub-pixel SPXL may include the first contact member CNT1 and the second contact member CNT2. The first contact member CNT1 and the second contact member CNT2 may pass through the second interlayer insulating layer ILD2 and the passivation layer PSV. The first electrode ELT1 and the first transistor electrode TE1 may be electrically connected to each other through the first contact member CNT1. The second electrode ELT2 and the power source line PL may be electrically connected to each other through the second contact member CNT2.

The display element layer DPL may be disposed on the pixel circuit layer PCL. The display element layer DPL may include a first insulating layer INS1, an insulating pattern INP, the alignment electrode ELT, the bank BNK, the light emitting element LD, a second insulating layer INS2, the first contact electrode CNE1, a third insulating layer INS3, the second contact electrode CNE2, and a fourth insulating layer INS4.

The insulating pattern INP may be disposed on the passivation layer PSV. The insulating pattern INP may have various shapes according to embodiments. In one or more embodiments, the insulating pattern INP may protrude in the thickness direction of the base layer BSL (e.g., the third direction DR3). Also, the insulating pattern INP may have an inclined surface inclined at an angle (e.g., a predetermined or selectable angle) with respect to the base layer BSL. However, the disclosure is not limited thereto, and the insulating pattern INP may have a sidewall having a curved surface or a stepped shape. For example, the insulating pattern INP may have a cross-section having a semi-circular or semi-elliptical shape.

The insulating pattern INP may form a step difference (e.g., a predetermined or selectable step difference), and the light emitting elements LD may be readily aligned in the emission area. According to one or more embodiments, the insulating pattern INP may be a barrier wall.

According to one or more embodiments, a portion of the alignment electrode ELT may be disposed on the insulating pattern INP. For example, the insulating pattern INP may include a first insulating pattern INP1 and a second insulating pattern INP2. The first electrode ELT1 may be disposed on the first insulating pattern INP1, and the second electrode ELT2 may be disposed on the second insulating pattern INP2. Accordingly, a reflective wall may be formed on the insulating pattern INP. For example, the portion of the alignment electrode ELT disposed on the insulating pattern INP may form the reflective wall. Accordingly, light emitted from the light emitting element LD may be recycled or reflected to improve light output efficiency of the display device DD (or the pixel PXL).

The insulating pattern INP may include at least one organic material and/or inorganic material. For example, the insulating pattern INP may include at least one organic material of an acrylates resin, an epoxy resin, a phenolic resin, a polyamides resin, a polyimides resin, a polyesters resin, a polyphenylenesulfides resin, and benzocyclobutene (BCB). However, the disclosure is not limited thereto, and the insulating pattern INP may include various kinds of inorganic materials including at least one of silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), and titanium oxide (TiOx).

The alignment electrode ELT may be disposed on the passivation layer PSV and/or the insulating pattern INP. As described above, the portion of the alignment electrode ELT may be disposed on the insulating pattern INP to form the reflective wall. The alignment signal (e.g., the AC signal and the ground signal) for aligning the light emitting element LD may be supplied to the alignment electrode ELT. According to one or more embodiments, an electrical signal (e.g., the anode signal and the cathode signal) may be supplied to the alignment electrode ELT, and the light emitting element LD may emit the light.

According to one or more embodiments, the alignment electrode ELT may be disposed on a rear surface of the first insulating layer INS1. For example, the alignment electrode ELT may be disposed between the insulating pattern INP and the first insulating layer INS1 or may be disposed between the passivation layer PSV and the first insulating layer INS1. For example, a surface of the alignment electrode ELT may be in contact with the first insulating layer INS1.

The first electrode ELT1 may be electrically connected to the light emitting element LD. The first electrode ELT1 may be electrically connected to the first contact electrode CNE1 through a contact hole formed in the first insulating layer INS1. The first electrode ELT1 may provide the anode signal to the light emitting element LD, and the light emitting element LD may emit the light.

The second electrode ELT2 may be electrically connected to the light emitting element LD. The second electrode ELT2 may be electrically connected to the second contact electrode CNE2 through a contact hole formed in the first insulating layer INS1. The second electrode ELT2 may provide the cathode signal (e.g., the ground signal) to the light emitting element LD, and the light emitting element LD may emit the light.

The first insulating layer INS1 may be disposed on the alignment electrode ELT. For example, the first insulating layer INS1 may cover the first electrode ELT1 and the second electrode ELT2.

The bank BNK may be disposed on the first insulating layer INS1. According to one or more embodiments, the bank BNK may include the first bank BNK1 and the second bank BNK2.

The first bank BNK1 may be disposed on the first insulating layer INS1. According to one or more embodiments, the first bank BNK1 may not overlap the emission area EMA and may overlap the non-emission area NEA in a plan view. As described above, the first bank BNK1 may protrude in the thickness direction (e.g., the third direction DR3) of the base layer BSL, and the first bank BNK1 may define the opening OPN. In the process of supplying the light emitting elements LD, a space, in which the light emitting elements LD may be provided, may be formed in the opening OPN.

The first bank BNK1 may include at least one organic material of an acrylates resin, an epoxy resin, a phenolic resin, a polyamides resin, a polyimides resin, a polyesters resin, a polyphenylenesulfides resin, and benzocyclobutene (BCB). However, the disclosure is not limited thereto. The first bank BNK1 may include various types of inorganic materials including at least one of silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), and titanium oxide (TiOx).

The second bank BNK2 may be disposed on the first bank BNK1. The second bank BNK2 may protrude in the thickness direction (e.g., the third direction DR3) of the base layer BSL, and the second bank BNK2 may define the opening OPN. A space in which the color conversion layer CCL is provided may be formed in the opening OPN.

The second bank BNK2 may include at least one organic material of an acrylates resin, an epoxy resin, a phenolic resin, a polyamides resin, a polyimides resin, a polyesters resin, a polyphenylenesulfides resin, and benzocyclobutene (BCB). However, the disclosure is not limited thereto. The second bank BNK2 may include various types of inorganic materials including at least one of silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), and titanium oxide (TiOx).

The light emitting element LD may be disposed on the first insulating layer INS1. According to one or more embodiments, the light emitting element LD may emit the light based on the electrical signals (e.g., the anode signal and the cathode signal) provided from the first contact electrode CNE1 and the second contact electrode CNE2.

The light emitting element LD may be disposed in a region adjacent to (e.g., surrounded by) the first bank BNK1. The light emitting element LD may be disposed between first insulating pattern INP1 and the second insulating pattern INP2.

The second insulating layer INS2 may be disposed on the light emitting element LD. The second insulating layer INS2 may cover the active layer AL of the light emitting element LD.

The second insulating layer INS2 may expose at least a portion of the light emitting element LD. For example, the second insulating layer INS2 may not cover the first end EP1 and the second end EP2 of the light emitting element LD. Accordingly, the first end EP1 and the second end EP2 of the light emitting element LD may be exposed, and may be electrically connected to the first contact electrode CNE1 and the second contact electrode CNE2, respectively.

In case that the second insulating layer INS2 is formed on the light emitting elements LD after the light emitting elements LD are aligned, it is possible to prevent the light emitting elements LD from being separated from the aligned positions.

The second insulating layer INS2 may have a single-layer or multi-layer structure. The second insulating layer INS2 may include various types of inorganic materials including at least one of silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), and titanium oxide (TiOx). However, the disclosure is not limited to the above-described examples.

The first contact electrode CNE1 and the second contact electrode CNE2 may be disposed on the first insulating layer INS1. The first contact electrode CNE1 may be electrically connected to the first end EP1 of the light emitting element LD. The second contact electrode CNE2 may be electrically connected to the second end EP2 of the light emitting element LD.

The first contact electrode CNE1 may be electrically connected to the first electrode ELT1 through a contact hole penetrating the first insulating layer INS1. The second contact electrode CNE2 may be electrically connected to the second electrode ELT2 through a contact hole penetrating the first insulating layer INS1.

The first contact electrode CNE1 and the second contact electrode CNE2 may include a conductive material. For example, the first contact electrode CNE1 and the second contact electrode CNE2 may include a transparent conductive material including at least one of indium tin oxide (ITO), indium zinc oxide (IZO), and indium tin zinc oxide (ITZO). Accordingly, the light emitted from the light emitting elements LD may pass through the first and second contact electrodes CNE1 and CNE2 and be emitted to outside of the display device DD. However, the disclosure is not limited to the above-described examples.

According to one or more embodiments, after any one of the first contact electrode CNE1 and the second contact electrode CNE2 is patterned, another electrode (e.g., another of the first contact electrode CNE1 and the second contact electrode CNE2) may be patterned. However, the disclosure is not limited to the above-described examples. The first contact electrode CNE1 and the second contact electrode CNE2 may be patterned at a same time in a same process.

The third insulating layer INS3 may be disposed on the first insulating layer INS1 and the first contact electrode CNE1. At least a portion of the third insulating layer INS3 may be disposed between the first contact electrode CNE1 and the second contact electrode CNE2. Accordingly, a short circuit defect between the first contact electrode CNE1 and the second contact electrode CNE2 may be prevented.

The fourth insulating layer INS4 may be disposed on the third insulating layer INS3 and the second contact electrode CNE2. The fourth insulating layer INS4 may protect components of the display element layer DPL from external influences (e.g., moisture, dust, or the like).

The third insulating layer INS3 and the fourth insulating layer INS4 may have a single-layer or multi-layer structure. The third insulating layer INS3 and the fourth insulating layer INS4 may include various types of inorganic materials including at least one of silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), and titanium oxide (TiOx).

The configuration of the pixel PXL including the color conversion layer CCL is described below with reference to FIG. 7. FIG. 7 shows the color conversion layer CCL, the optical layer OPL, the color filter layer CFL, and the like. For convenience of description, components other than the second bank BNK2 among the pixel circuit layer PCL and the display element layer DPL among the above-described components are omitted in FIG. 7.

Referring to FIG. 7, the second bank BNK2 may be disposed between the first to third sub-pixels SPXL1, SPXL2, and SPXL3 or at a boundary between the first to third sub-pixels SPXL1, SPXL2, and SPXL3. The second bank BNK2 may define spaces (or regions) overlapping the first to third sub-pixels SPXL1, SPXL2, and SPXL3 in a plan view, respectively. The spaces defined by the second bank BNK2 may be regions in which the color conversion layer CCL may be provided.

The color conversion layer CCL may be disposed on the light emitting elements LD (e.g., refer to FIG. 6) in a space adjacent to (e.g., surrounded by) the second bank BNK2. The color conversion layer CCL may include a first color conversion layer CCL1 disposed on the first sub-pixel SPXL1, a second color conversion layer CCL2 disposed on the second sub-pixel SPXL2, and a scattering layer LSL disposed on the third sub-pixel SPXL3.

The color conversion layer CCL may be disposed on the light emitting element LD. The color conversion layer CCL may be configured to change a wavelength of light. In one or more embodiments, the first to third sub-pixels SPXL1, SPXL2, and SPXL3 may include light emitting elements LD emitting light of a same color. For example, the first to third sub-pixels SPXL1, SPXL2, and SPXL3 may include light emitting elements LD emitting light of the third color (or blue). The color conversion layer CCL including color conversion particles may be disposed on each of the first to third sub-pixels SPXL1, SPXL2, and SPXL3, and a full-color image may be displayed.

The first color conversion layer CCL1 may include first color conversion particles that convert light of the third color emitted from the light emitting element LD into light of the first color. For example, the first color conversion layer CCL1 may include first quantum dots QD1 dispersed in a matrix material (e.g., a predetermined or selectable matrix material) such as a base resin.

In one or more embodiments, in case that the light emitting element LD is a blue light emitting element emitting blue light and the first sub-pixel SPXL1 is a red pixel, the first color conversion layer CCL1 may include the first quantum dots QD1 that convert blue light emitted from the blue light emitting element into red light. The first quantum dots QD1 may absorb blue light and shift the wavelength according to energy transition to emit red light. In case that the first sub-pixel SPXL1 is a pixel of a different color, the first color conversion layer CCL1 may include the first quantum dots QD1 corresponding to the color of the first sub-pixel SPXL1.

The second color conversion layer CCL2 may include second color conversion particles that convert light of the third color emitted from the light emitting element LD into light of the second color. For example, the second color conversion layer CCL2 may include second quantum dots QD2 dispersed in a matrix material (e.g., a predetermined or selectable matrix material) such as a base resin.

In one or more embodiments, in case that the light emitting element LD is a blue light emitting element emitting blue light and the second sub-pixel SPXL2 is green pixel, the second color conversion layer CCL2 may include the second quantum dots QD2 that convert blue light emitted from the blue light emitting element into green light. The second quantum dots QD2 may absorb blue light and shift the wavelength according to energy transition to emit green light. In case that the second sub-pixel SPXL2 is a pixel of a different color, the second color conversion layer CCL2 may include the second quantum dots QD2 corresponding to the color of the second sub-pixel SPXL2.

In one or more embodiments, blue light having a relatively short wavelength in the visible light region may be incident on the first quantum dots QD1 and the second quantum dots QD2, respectively, and absorption coefficients of the first quantum dots QD1 and the second quantum dots QD2 may be increased. Accordingly, the efficiency of light finally emitted from the first sub-pixel SPXL1 and the second sub-pixel SPXL2 may be improved, and excellent color reproducibility may be secured. The emission part EMU of the first to third sub-pixels SPXL1, SPXL2, and SPXL3 may be configured using light emitting elements LD of a same color (e.g., blue light emitting elements), and the manufacturing efficiency of the display device DD may be improved.

The scattering layer LSL may be provided to efficiently use the light of the third color (or blue) emitted from the light emitting element LD. For example, in case that the light emitting element LD is a blue light emitting element emitting blue light and the third sub-pixel SPXL3 is a blue pixel, the scattering layer LSL may include at least one type of scatterers SCT in order to efficiently use the light emitted from the light emitting element LD. For example, the scatterers SCT of the scattering layer LSL may include at least one of barium sulfate ($BaSO_4$), calcium carbonate ($CaCO_3$), titanium oxide ($TiO_2$), silicon oxide ($SiO_2$), aluminum oxide ($Al_2O_3$), zirconium oxide ($ZrO_2$), and zinc oxide (ZnO). The scatterers SCT may not be disposed only in the third sub-pixel SPXL3, and may also be selectively included in the first color conversion layer CCL1 or the second color conversion layer CCL2. According to one or more embodiments, the scatterers SCT may be omitted and the scattering layer LSL made of a transparent polymer may be provided in the space of the third sub-pixel SPXL3.

A first capping layer CPL1 may be disposed on the color conversion layer CCL. The first capping layer CPL1 may be provided over the first to third sub-pixels SPXL1, SPXL2, and SPXL3. The first capping layer CPL1 may cover the color conversion layer CCL. The first capping layer CPL1 may prevent impurities such as moisture or air from penetrating from outside from damaging or contaminating the color conversion layer CCL.

The first capping layer CPL1 may be an inorganic layer, and may include at least one of silicon nitride (SiNx), aluminum nitride (AlNx), titanium nitride (TiNx), silicon oxide (SiOx), aluminum oxide (AlOx), titanium oxide (TiOx), silicon oxycarbide (SiOxCy), and silicon oxynitride (SiOxNy). However, the disclosure is not limited thereto.

The optical layer OPL may be disposed on the first capping layer CPL1. The optical layer OPL may recycle light provided from the color conversion layer CCL by total reflection and improve light extraction efficiency. Thus, the optical layer OPL may have a refractive index relatively lower the color conversion layer CCL. For example, a refractive index of the color conversion layer CCL may be in a range of about 1.6 to about 2.0, and the refractive index of the optical layer OPL may be in a range of about 1.1 to about 1.3.

A second capping layer CPL2 may be disposed on the optical layer OPL. The second capping layer CPL2 may be provided over the first to third sub-pixels SPXL1, SPXL2, and SPXL3. The second capping layer CPL2 may cover the optical layer OPL. The second capping layer CPL2 may prevent impurities such as moisture or air from penetrating from outside from damaging or contaminating the optical layer OPL.

The second capping layer CPL2 may be an inorganic layer, and may include at least one of silicon nitride (SiNx), aluminum nitride (AlNx), titanium nitride (TiNx), silicon oxide (SiOx), aluminum oxide (AlOx), titanium oxide (TiOx), silicon oxycarbide (SiOxCy), and silicon oxynitride (SiOxNy). However, the disclosure is not limited thereto.

A planarization layer PLL may be disposed on the second capping layer CPL2. The planarization layer PLL may be provided over the first to third sub-pixels SPXL1, SPXL2, and SPXL3.

The planarization layer PLL may include an organic material such as an acrylic resin, an epoxy resin, a phenolic resin, a polyamide resin, a polyimide resin, a polyester resin, a polyphenylenesulfide resin, or benzocyclobutene (BCB). However, the disclosure is not limited thereto. The planarization layer PLL may include various types of inorganic materials such as silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The color filter layer CFL may be disposed on the planarization layer PLL. The color filter layer CFL may include a first color filter CF1, a second color filter CF2, and a third color filter CF3, which match the color of each pixel PXL (or the first to third sub-pixel SPXL1 to SPXL3). The color filters CF1, CF2, and CF3 matching the colors of the first to third sub-pixels SPXL1, SPXL2, and SPXL3, respectively, may be disposed, and the full-color image may be displayed.

The color filter layer CFL may include a first color filter CF1 disposed on the first sub-pixel SPXL1 to selectively transmit light emitted from the first sub-pixel SPXL1, a second color filter CF2 disposed on the second sub-pixel SPXL2 to selectively transmit light emitted from the second sub-pixel SPXL2, and a third color filter CF3 disposed on the third sub-pixel SPXL3 to selectively transmit light emitted from the third sub-pixel SPXL3.

In one or more embodiments, the first color filter CF1, the second color filter CF2, and the third color filter CF3 may be a red color filter, a green color filter, and a blue color filter, respectively. However, the disclosure is not limited thereto. Hereinafter, any color filter among the first color filter CF1, the second color filter CF2, and the third color filter CF3 may be referred to as "color filter CF", and two or more types of color filters may be referred to as "color filters CF".

The first color filter CF1 may overlap the first color conversion layer CCL1 in a thickness direction (e.g., the third direction DR3) of the substrate SUB. The first color filter CF1 may include a color filter material that selectively transmits light of the first color (or red). For example, in case that the first sub-pixel SPXL1 is a red pixel, the first color filter CF1 may include a red color filter material.

The second color filter CF2 may overlap the second color conversion layer CCL2 in the thickness direction (e.g., the third direction DR3) of the substrate SUB. The second color filter CF2 may include a color filter material that selectively transmits light of the second color (or green). For example, in case that the second sub-pixel SPXL2 is a green pixel, the second color filter CF2 may include a green color filter material.

The third color filter CF3 may overlap the scattering layer LSL in the thickness direction (e.g., the third direction DR3) of the substrate SUB. The third color filter CF3 may include a color filter material that selectively transmits light of the third color (or blue). For example, in case that the third sub-pixel SPXL3 is a blue pixel, the third color filter CF3 may include a blue color filter material.

According to one or more embodiments, a light blocking layer BM may be further disposed between the first to third color filters CF1, CF2, and CF3. The light blocking layer BM may be formed between the first to third color filters CF1, CF2, and CF3, and color mixing defects visually recognized from the front or side of the display device DD may be prevented. For example, the light blocking layer BM may be disposed between the first to third color filters CF1, CF2, and CF3, and prevent the color mixing therebetween. The material of the light blocking layer BM is not limited thereto, and the light blocking layer BM may be composed of various light blocking materials. For example, the light blocking layer BM may include a black matrix or may be implemented by stacking the first to third color filters CF1, CF2, and CF3 on each other.

An overcoat layer OC may be disposed on the color filter layer CFL. The overcoat layer OC may be provided over the first to third sub-pixels SPXL1, SPXL2, and SPXL3. The overcoat layer OC may cover a lower member including the color filter layer CFL. The overcoat layer OC may prevent moisture or air from penetrating into the above-described lower member (e.g., the color filter layer CFL). The overcoat layer OC may protect the above-described lower member from foreign substances such as dust or moisture.

The overcoat layer OC may include an organic material such as an acrylic resin, an epoxy resin, a phenolic resin, a polyamide resin, a polyimide resin, a polyester resin, a polyphenylenesulfide resin, or benzocyclobutene (BCB). However, the disclosure is not limited thereto. The overcoat layer OC may include various types of inorganic materials such as silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The outer film layer OFL may be disposed on the overcoat layer OC. The outer film layer OFL may be disposed outside the display device DD to reduce external influences. The outer film layer OFL may be provided over the first to third sub-pixels SPXL1, SPXL2, and SPXL3. According to one or more embodiments, the outer film layer OFL may include one of a polyethyleneterephthalate (PET) film, a low reflection film, a polarizing film, and a transmittance controllable film, but the disclosure is not limited thereto. According to one or more embodiments, the pixel PXL may include an upper substrate instead of the outer film layer OFL.

Hereinafter, cross-sectional structures of the base layer BSL and the pad PAD according to embodiments are described below with reference to FIGS. 8 to 14. Detailed description of the same constituent elements is briefly described or omitted.

Figure 8:
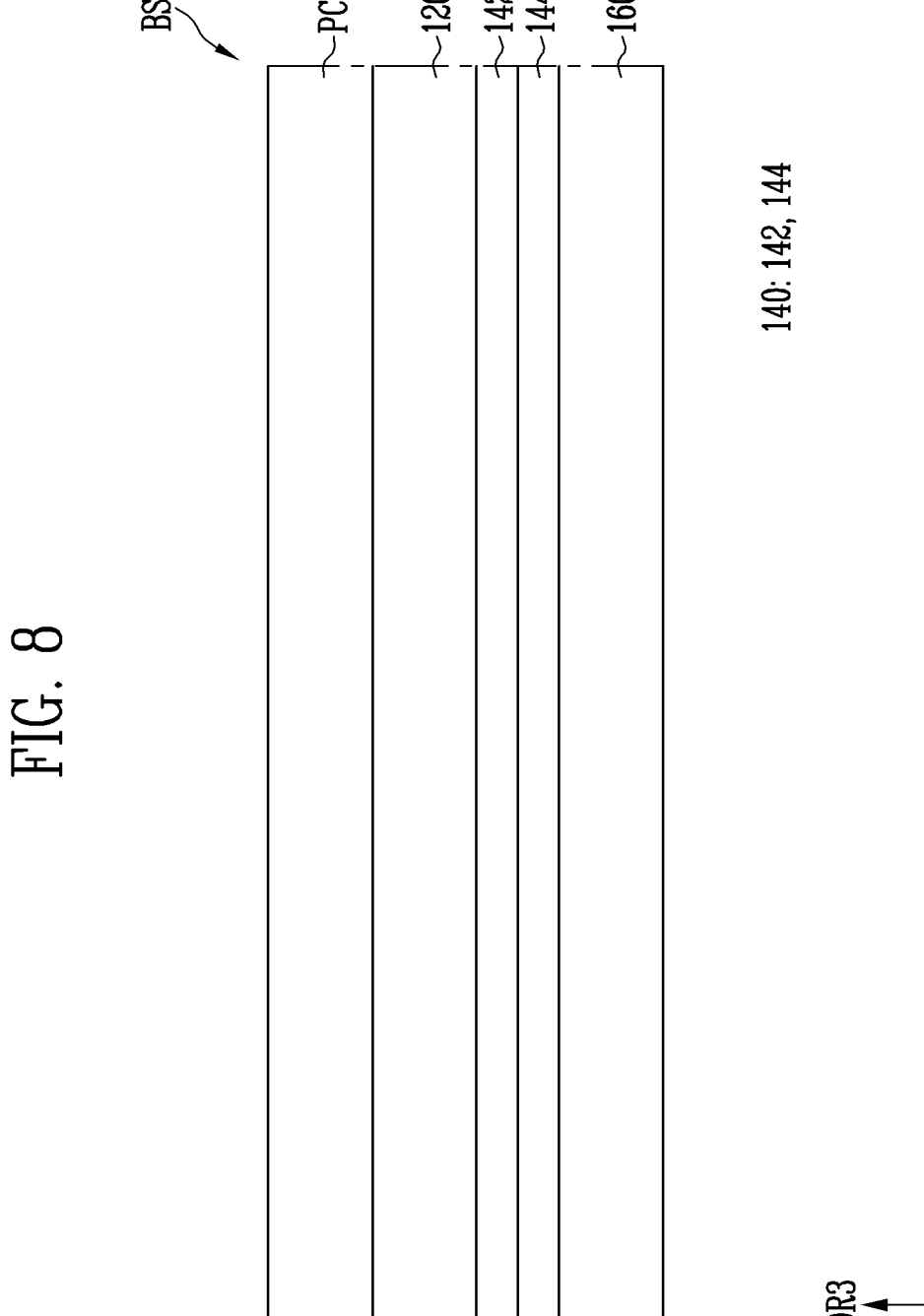
FIG. 8 is a cross-sectional view schematically illustrating a base layer according to one or more embodiments.

A structure of the base layer BSL is described below with reference to FIG. 8. FIG. 8 is a cross-sectional view schematically illustrating a base layer according to one or more embodiments. In FIG. 8, for convenience of description, the pixel circuit layer PCL is schematically shown and components disposed on the pixel circuit layer PCL are omitted.

Referring to FIG. 8, the base layer BSL may include multiple layers. According to one or more embodiments, the base layer BSL may include the first base layer 120, the barrier layer 140, and the second base layer 160. Based on a rear surface of the pixel circuit layer PCL, the first base layer 120, the barrier layer 140, and the second base layer 160 of the base layer BSL may be sequentially disposed (or stacked).

The first base layer 120 may form a base surface on which the pixel circuit layer PCL is disposed. For example, a surface (e.g., the base surface) of the first base layer 120 may be adjacent to (or in contact with) the pixel circuit layer PCL, and another surface (e.g., an opposite surface to the base surface) of the first base layer 120 may be adjacent to (or in contact with) the barrier layer 140. According to one or more embodiments, the first base layer 120 may include one or more various materials as described above. According to one or more embodiments, the first base layer 120 may include polyimide. However, the disclosure is not limited thereto.

The barrier layer 140 may be disposed between the first base layer 120 and the second base layer 160. The barrier layer 140 may be disposed between the first base layer 120 and the second base layer 160, and may cover at least a portion of each layer of the pads PAD (e.g., refer to FIG. 9). The barrier layer 140 may include at least one selected from the group consisting of amorphous silicon (a-Si), silicon oxide (SiOx), silicon nitride (SiNx), silicon oxynitride (SiOxNy), aluminum oxide (AlOx), and titanium oxide (TiOx).

According to one or more embodiments, the barrier layer 140 may include a first barrier layer 142 and a second barrier layer 144. A surface of the first barrier layer 142 may face the first base layer 120, and another surface of the first barrier layer 142 may face the second base layer 160 and the second barrier layer 144. A surface of the second barrier layer 144 may face the second base layer 160, and another surface of the second barrier layer 144 may face the first base layer 120 and the first barrier layer 142.

According to one or more embodiments, the first barrier layer 142 may have a structure in which a layer including silicon nitride (SiNx) and a layer including silicon oxynitride (SiOxNy) are alternately disposed. The second barrier layer 144 may have a structure in which a layer including amorphous silicon (a-Si) and a layer including silicon oxide (SiOx) are alternately disposed. However, the disclosure is not limited to the above-described examples.

The second base layer 160 may form a base surface on which the chip-on-film COF is disposed. For example, a surface (e.g., the base surface) of the second base layer 160 may be adjacent to (or in contact with) the chip-on-film COF, and another surface (e.g., an opposite surface to the base surface) of the second base layer 160 may be adjacent to (or in contact with) the barrier layer 140. According to one or more embodiments, the second base layer 160 may include one or more various materials as described above. According to one or more embodiments, the second base layer 160 may include polyimide. However, the disclosure is not limited thereto.

Figure 9:
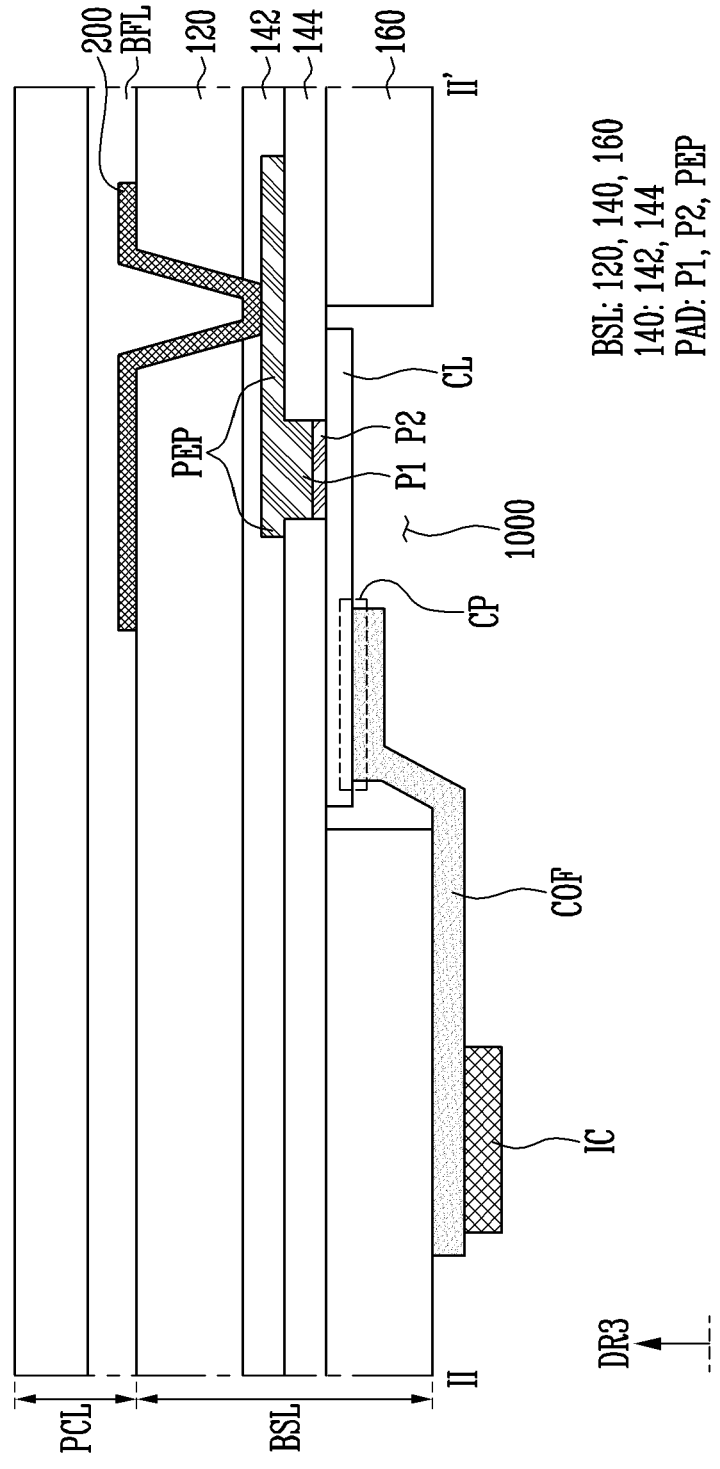
FIG. 9 is a schematic cross-sectional view taken along line II-II' of FIG. 4.

Detailed description of the base layer BSL, the pads PAD disposed adjacent to the base layer BSL, and components electrically connected to the pads PAD is provided below with reference to FIG. 9. FIG. 9 is a schematic cross-sectional view taken along line II-II' of FIG. 4. In FIG. 9, for convenience of description, the pixel circuit layer PCL is schematically shown, and components disposed on the pixel circuit layer PCL are omitted.

Referring to FIG. 9, components electrically connected to the pads PAD are disclosed. For example, the pads PAD may be electrically connected to the lower connection electrode 200 and the connection line CL.

At least a portion of the lower connection electrode 200 may be disposed on the first base layer 120, and another portion of the lower connection electrode 200 may pass through the first base layer 120 and the first barrier layer 142 to be electrically connected to the pads PAD. For example, another portion of the lower connection electrode 200 may pass through one or more layers and may be electrically connected to an extension pad layer PEP of the pads PAD. Accordingly, as described above, an electrical signal (e.g., the data signal) supplied through the pads PAD may be supplied to the lower connection electrode 200.

The pads PAD may be disposed between the first base layer 120 and the second base layer 160. At least a portion of the pads PAD may be covered by the barrier layers 140. The pads PAD may be disposed on a rear surface of the first base layer 120. Based on the first base layer 120, the pads PAD may be spaced apart by a distance similar to that of the barrier layer 140. For example, the barrier layer 140 may have openings spaced apart from each other by the distance, and portions of the pads PAD may be disposed in the openings.

The pads PAD may include a first pad layer P1, a second pad layer P2, and the extension pad layer PEP. However, the disclosure is not limited thereto. According to one or more embodiments, the pads PAD may further include an additional pad layer.

The first pad layer P1 may be disposed on a rear surface of the second pad layer P2 and electrically connected to the extension pad layer PEP. According to one or more embodiments, the first pad layer P1 and the extension pad layer PEP may be integral with each other. A side surface of the first pad layer P1 may be covered by the second barrier layer 144. A surface of the first pad layer P1 may be covered by the first barrier layer 142. The first pad layer P1 may be electrically connected to the second pad layer P2 and the extension pad layer PEP.

The second pad layer P2 may be disposed on a surface of the first pad layer P1 and electrically connected to the connection line CL. According to one or more embodiments, the second pad layer P2 may be in contact with the connection line CL. A side surface of the second pad layer P2 may be covered by the second barrier layer 144. The second pad layer P2 may be electrically connected to the first pad layer P1 and the connection line CL.

The extension pad layer PEP may extend from the first pad layer P1. For example, the extension pad layer PEP and the first pad layer P1 may be integral with each other, and the extension pad layer PEP may refer to a layer extending in a direction compared to the first pad layer P1 overlapping the second pad layer P2 in a plan view.

According to one or more embodiments, the second pad layer P2 may include a material different from that of the first pad layer P1 and the extension pad layer PEP. For example, the second pad layer P2 may include indium zinc oxide (IZO). The first pad layer P1 and the extension pad layer PEP may include copper (Cu). According to one or more embodiments, the second pad layer P2 including a material different from that of the first pad layer P1 may cover the first pad layer P1. In case that a process for forming an open area 1000 (e.g., a plasma etching process PLSA of FIG. 19) is performed, the second pad layer P2 may protect the first pad layer P1. For example, the plasma etching PLSA may be performed on the second base layer 160. According to one or more embodiments, the second pad layer P2 may be an etch stopper layer for the first pad layer P1. For example, the second pad layer P2 forming an outer periphery of the pads PAD may selectively include the IZO, the pads PAD (e.g., the first pads P1) may be effectively protected from external influences under the environment in which the etching process is performed. Description thereof is provided in detail below with reference to FIG. 19.

According to one or more embodiments, the second base layer 160 may form the open area 1000 and expose the second barrier layer 144 and the second pad layer P2. Accordingly, the connection line CL may be patterned on the second pad layer P2, and the second pad layer P2 may be electrically connected to the connection line CL. According to one or more embodiments, the open area 1000 may correspond to an area in which the second base layer 160 is not disposed. According to one or more embodiments, the second base layer 160 may not overlap the second pad layer P2 in a plan view.

The connection line CL may be disposed on the second barrier layer 144 and the second pad layer P2 in the open area 1000. The connection line CL may be patterned and extend in a direction to electrically connect the chip-on-film COF and the second pad layer P2.

A portion of the chip-on-film COF may be disposed in the open area 1000 and may be electrically connected to the connection line CL through the connection portion CP. Another portion of the chip-on-film COF may be an area other than the open area 1000 and may be disposed on a rear surface of the second base layer 160. According to one or more embodiments, an electrode line and/or an anisotropic conductive film may be disposed between the chip-on-film COF and the connection line CL. Accordingly, the chip-on-film COF and the connection line CL may be electrically connected to each other.

The driving chip IC may be disposed on a surface of the chip-on-film COF or may be mounted on a portion of the chip-on-film COF. As described above, the driving chip IC may output the data signal and may be electrically connected to the chip-on-film COF. Accordingly, the data signal output from the driving chip IC may be supplied to the data line DL through the chip-on-film COF, the connection line CL, the pads PAD, and the lower connection electrode 200.

A cross-sectional structure of the pads PAD according to one or more embodiments is provided below with reference to FIGS. 10 to 14. FIGS. 10 to 14 are cross-sectional views schematically illustrating pads in accordance with one or more embodiments. Detailed description of the same constituent elements is briefly described or omitted.

Figure 10:
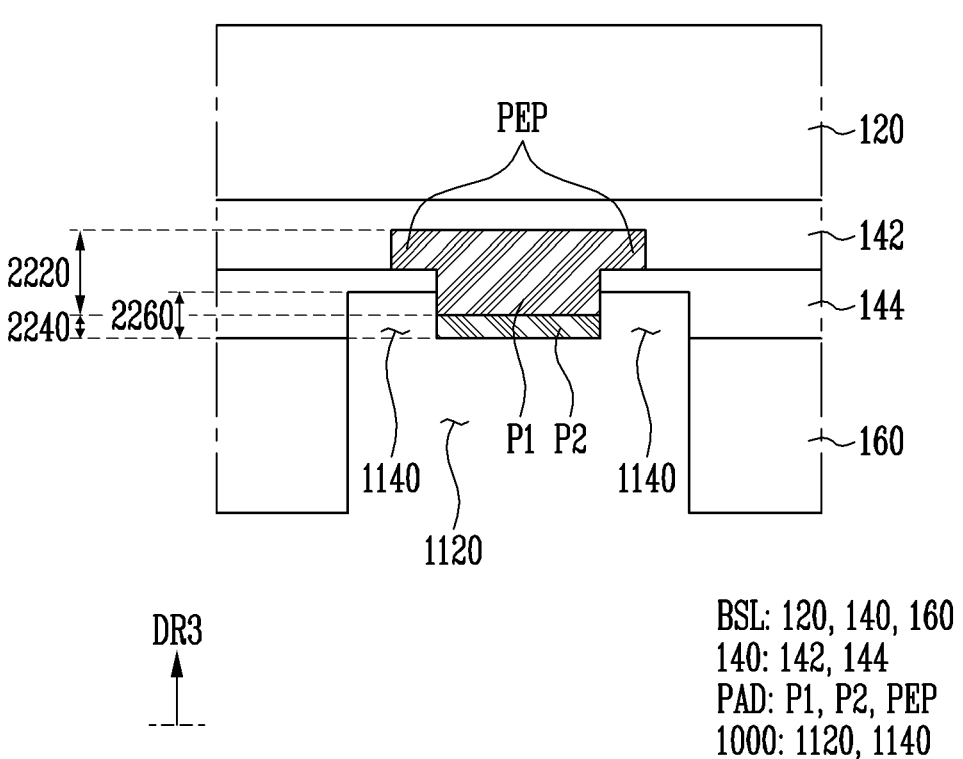
FIGS. 10 to 14 are cross-sectional views schematically illustrating pads in accordance with one or more embodiments.

Detailed description of the pads PAD according to a first embodiment is provided below with reference to FIG. 10. FIG. 10 may be a cross-sectional view illustrating the pads PAD according to the first embodiment.

Referring to FIG. 10, in the pads PAD according to the first embodiment, a portion of the first pad layer P1 and the second pad layer P2 may protrude in a lower direction (e.g., an opposite direction to the third direction DR3). For example, the portion of the first pad layer P1 and the second pad layer P2 may protrude with respect to a recessed surface of the second barrier layer 144.

According to one or more embodiments, the open area 1000 may include a main open area 1120 and a sub-open area 1140. The main open area 1120 may be an area exposing a surface of the second pad layer P2 and may be spaced apart from the first base layer 120 by a distance corresponding to the second base layer 160. The sub-open area 1140 may be an area exposing the side surface of the first pad layer P1 and the side surface of the second pad layer P2. For example, the second base layer 160 may have the main open area 1120 having a depth (e.g., the distance), at which the first pad layer P1 is recessed in the main open area 1120.

For example, when a process for forming the open area 1000 is performed, the second barrier layer 144 may be more etched than the second pad layer P2. Accordingly, the second barrier layer 144 may be recessed to form the sub-open area 1140.

According to one or more embodiments, the pads PAD may have a thickness 2260 of a protrusion (e.g., a predetermined or selectable thickness 2260 of a protrusion). The first pad layer P1 may have a first pad thickness 2220. The second pad layer P2 may have a second pad thickness 2240. According to one or more embodiments, the first pad thickness 2220 may be a thickness of a conductive layer deposited to form the first pad layer P1. The second pad thickness 2240 may be a thickness of a conductive layer deposited to form the second pad layer P2. The thickness 2260 of the protrusion may be a thickness of an area not covered by the barrier layer 140, and may be a thickness of the pads PAD exposed in the thickness direction of the base layer BSL (e.g., a direction parallel to the third direction DR3). According to one or more embodiments, a height of exposed sides of the pads PAD may correspond to the thickness 2260 of the protrusion.

According to one or more embodiments, the thickness 2260 of the protrusion may be greater than the second pad thickness 2240. The thickness 2260 of the protrusion may be in a range of about 4,000 Å to about 7,000 Å. The second pad thickness 2240 may be in a range of about 500 Å to about 700 Å. However, the disclosure is not limited to the above-described examples.

According to the first embodiment, the pads PAD may have a structure that protrudes from a surface (e.g., a surface of the second barrier layer 144). The exposed areas of the pads PAD may be expanded, and the connection line CL (e.g., refer to FIG. 9) and the pads PAD may be electrically connected to each other.

When an etching process for forming the second base layer 160 is performed, the second pad layer P2 may include IZO. Thus, the effect of the etching process on the first pad layer P1 may be substantially reduced. For example, the second pad layer P2 may be implemented with an etch stop layer for the first pad layer P1.

Figure 11:
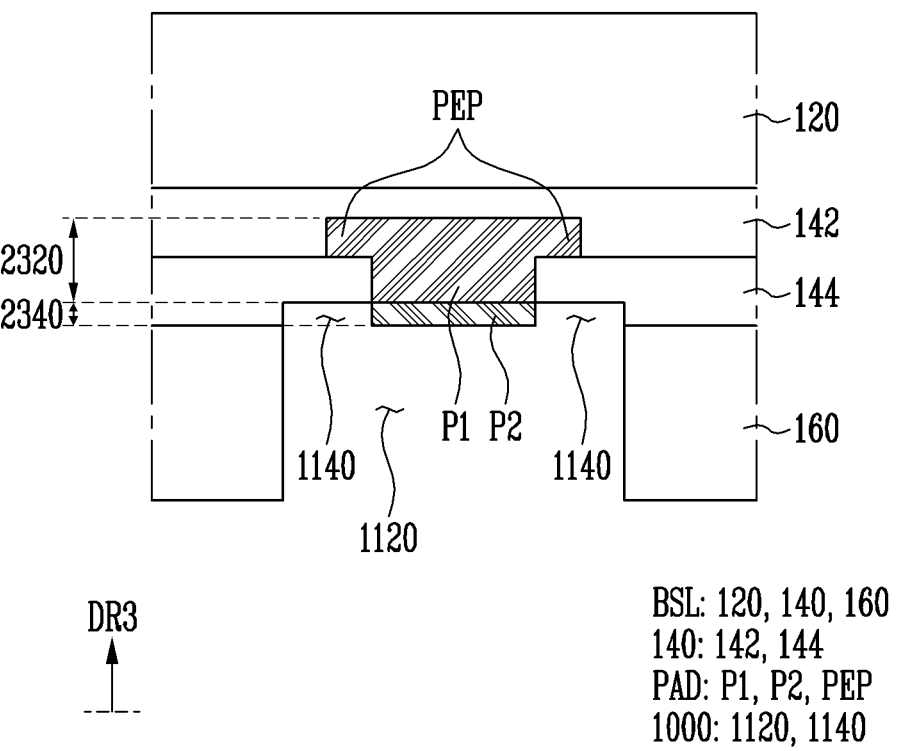

Detailed description of the pads PAD according to a second embodiment is provided below with reference to FIG. 11. FIG. 11 may be a cross-sectional view illustrating the pads PAD according to the second embodiment. Difference between the pads PAD according to the second embodiment and the above-described embodiment is described below.

The pads PAD according to the second embodiment may be different from the pads PAD according to the first embodiment at least in that the side surface of the first pad layer P1 is not exposed.

Referring to FIG. 11, a second barrier layer 144 may cover (e.g., entirely cover) a side surface of a first pad layer P1. Accordingly, the first pad layer P1 may be electrically connected to a second pad layer P2 without being exposed by a barrier layer 140. According to one or more embodiments, the first pad layer P1 may have a first pad thickness 2320. According to one or more embodiments, the second barrier layer 144 may not cover a side surface of the second pad layer P2. Accordingly, a second pad thickness 2340 of the second pad layer P2 may be substantially the same as a thickness of a protrusion of the pads PAD. For example, by controlling process parameters of a plasma etching process PLSA (e.g., refer to FIG. 19) for forming an open area 1000, the degree to which the second barrier layer 144 is etched may be controlled, and the side surface of the second pad layer P2 may be exposed (e.g., entirely exposed) and the first pad layer P1 may not be exposed. Thus, damage to the first pad layer P1 may be prevented, and the pads PAD may sufficiently protrude.

Figure 12:
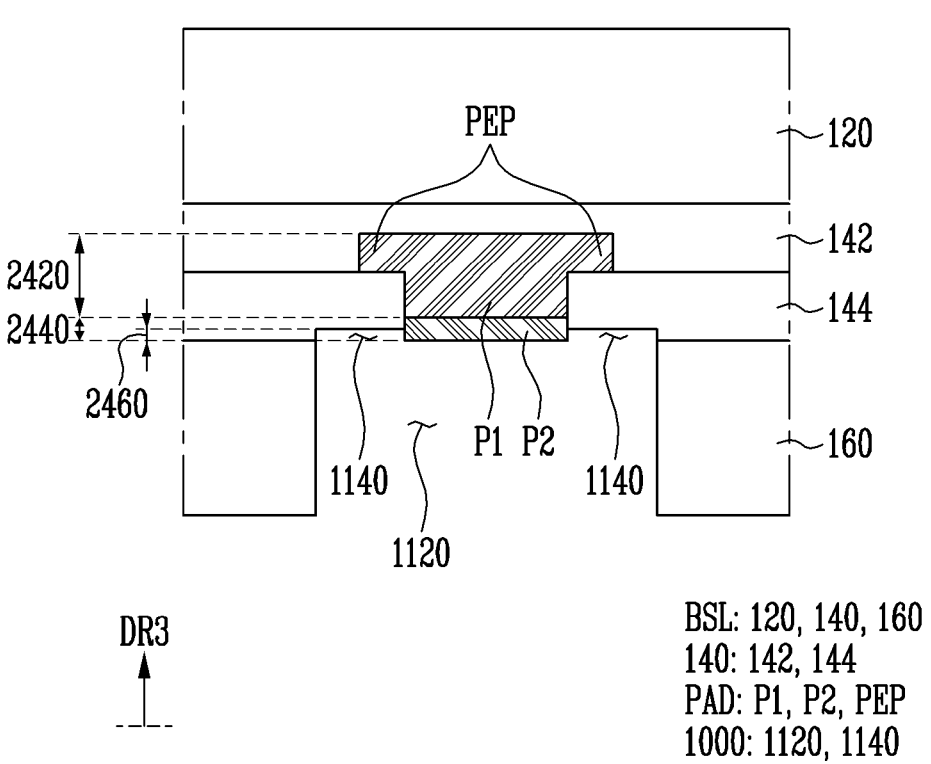

Detailed description of the pads PAD according to a third embodiment is provided below with reference to FIG. 12. FIG. 12 may be a cross-sectional view illustrating the pads PAD according to the third embodiment. Difference between the pads PAD according to the third embodiment and the above-described embodiments is described below.

The pads PAD according to the third embodiment may be different from the pads PAD according to the second embodiment at least in that the barrier layer 140 covers at least a portion of the side surface of the second pad layer P2.

Referring to FIG. 12, a second barrier layer 144 may cover (e.g., entirely cover) a side surface of a first pad layer P1 and may cover a portion of a side surface of the second pad layer P2. A portion of the side surface of the second pad layer P2 may be covered by a barrier layer 140, but another portion of the side surface of the second pad layer P2 and a surface of the second pad layer P2 may be exposed. Similar to the above, the side surface and a surface of the second pad layer P2 may be exposed, and electrical connection with a connection line CL may be facilitated. According to one or more embodiments, the first pad layer P1 may have a first pad thickness 2420. According to one or more embodiments, the second barrier layer 144 may cover a portion of the side surface of the second pad layer P2, and accordingly, a thickness 2460 of a protrusion of the pads PAD may be smaller than a second pad thickness 2440 of the second pad layer P2. For example, the second barrier layer 144 may cover (e.g., entirely cover) the side surface of the first pad layer P1, but may additionally cover a portion of the side surface of the second pad layer P2. Thus, a risk of exposing a portion of the first pad layer P1 may be further prevented.

Figure 13:
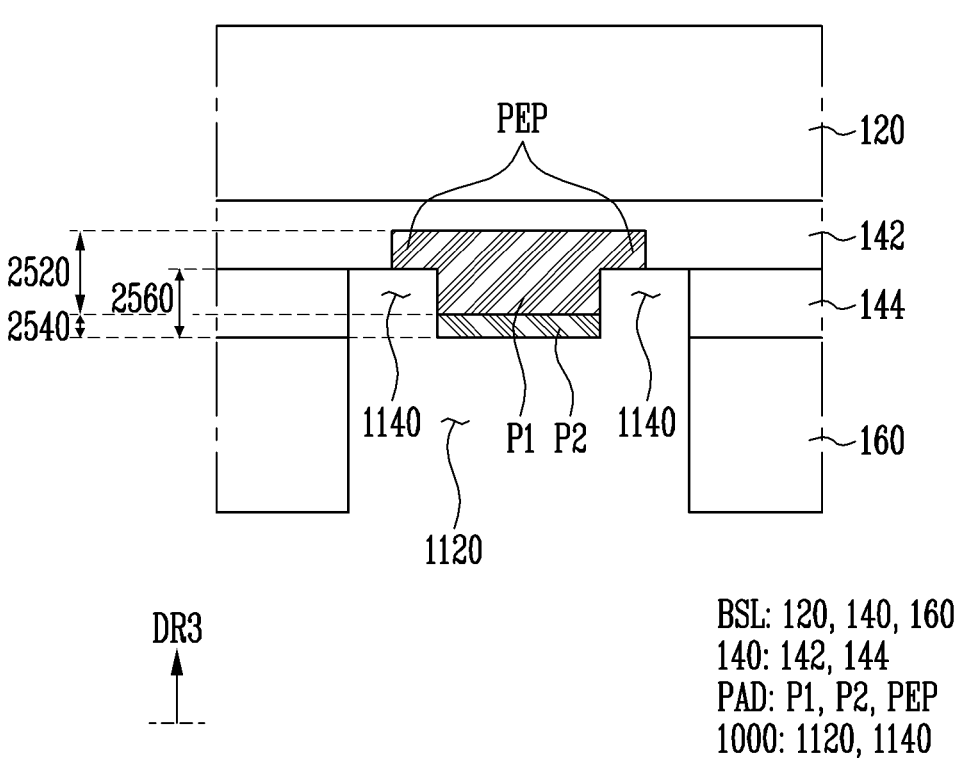

Detail description of the pads PAD according to a fourth embodiment is provided below with reference to FIG. 13. FIG. 13 may be a cross-sectional view illustrating the pads PAD according to the fourth embodiment. Difference between the pads PAD according to the fourth embodiment and the above-described embodiments is described below.

The pads PAD according to the fourth embodiment may be different from the pads PAD according to the first embodiment at least in that the extension pad layer PEP is exposed by the second barrier layer 144.

Referring to FIG. 13, the second barrier layer 144 may not cover a side surface of a first pad layer P1, and the side surface of the first pad layer P1 may be exposed (e.g., entirely exposed). For example, the second barrier layer 144 and the side surface of the first pad layer P1 may not contact each other, and a surface and the side surface of the first pad layer P1 may be exposed (e.g., entirely exposed). Similar to the above, a surface and the side surface of the first pad layer P1 may be exposed (e.g., entirely exposed), and a side surface of the second pad layer P2 may be exposed (e.g., entirely exposed). Thus, electrical connection with a connection line CL may be facilitated. According to one or more embodiments, the first pad layer P1 may have a first pad thickness 2520. According to one or more embodiments, the second barrier layer 144 may expose (e.g., entirely expose) the side surface of the first pad layer P1, and accordingly, a thickness 2560 of the protrusion of the pads PAD may be greater than a second pad thickness 2540 of the second pad layer P2. According to the fourth embodiment, the degree to which the pads PAD protrude may be maximized. Accordingly, in the structure of the pads PAD according to the fourth embodiment, the difficulty of the process of connecting the connection line CL may be alleviated (or decreased).

Figure 14:
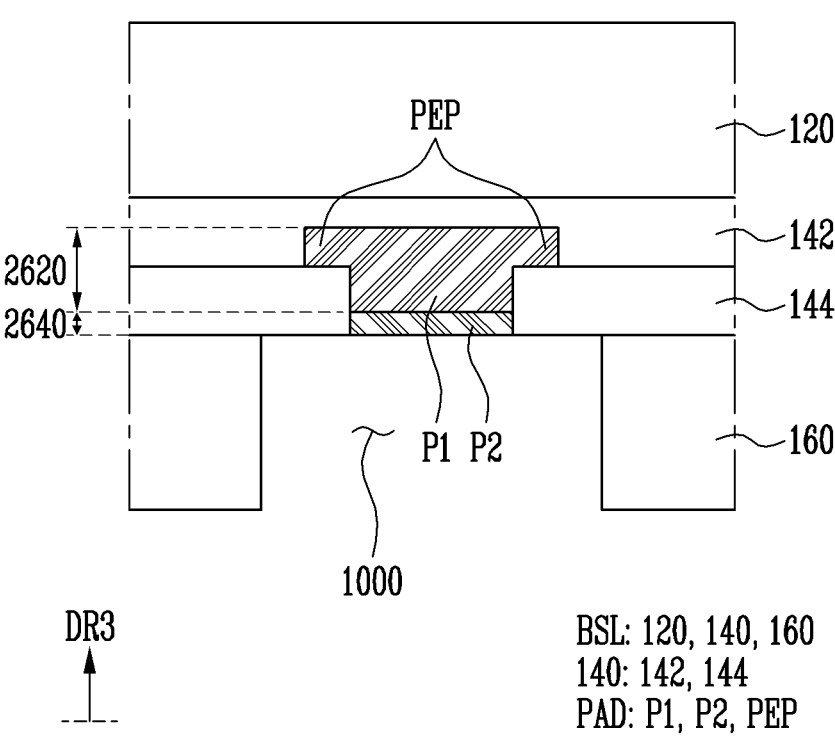

Detailed description of the pads PAD according to a fifth embodiment is provided below with reference to FIG. 14. FIG. 14 may be a cross-sectional view illustrating the pads PAD according to the fifth embodiment. Difference between the pads PAD according to the fifth embodiment and the above-described embodiments is described below.

The pads PAD according to the fifth embodiment may be different from the embodiments described above at least in that the pads PAD do not protrude with respect to the barrier layer 140.

Referring to FIG. 14, a second barrier layer 144 may cover (e.g., entirely cover) a side surface of a first pad layer P1 and a side surface of a second pad layer P2. Accordingly, the side surface of the first pad layer P1 and the side surface of the second pad layer P2 may not be exposed, and only a surface (e.g., a lower surface) of the second pad layer P2 may be exposed. According to one or more embodiments, the first pad layer P1 may have a first pad thickness 2620. The second pad layer P2 may have a second pad thickness 2640. The side surface of the second pad layer P2 may not be exposed, and the pads PAD may not protrude with respect to a barrier layer 140.

A method of manufacturing the display device DD according to one or more embodiments is described below with reference to FIGS. 15 to 20. FIGS. 15 to 20 are cross-sectional views schematically illustrating a method of manufacturing a display device according to one or more embodiments. Detailed description of the same constituent elements is briefly described or omitted.

Figure 15:
FIGS. 15 to 20 are cross-sectional views schematically illustrating a method of manufacturing a display device according to one or more embodiments.
Figure 15:
Figure 16:
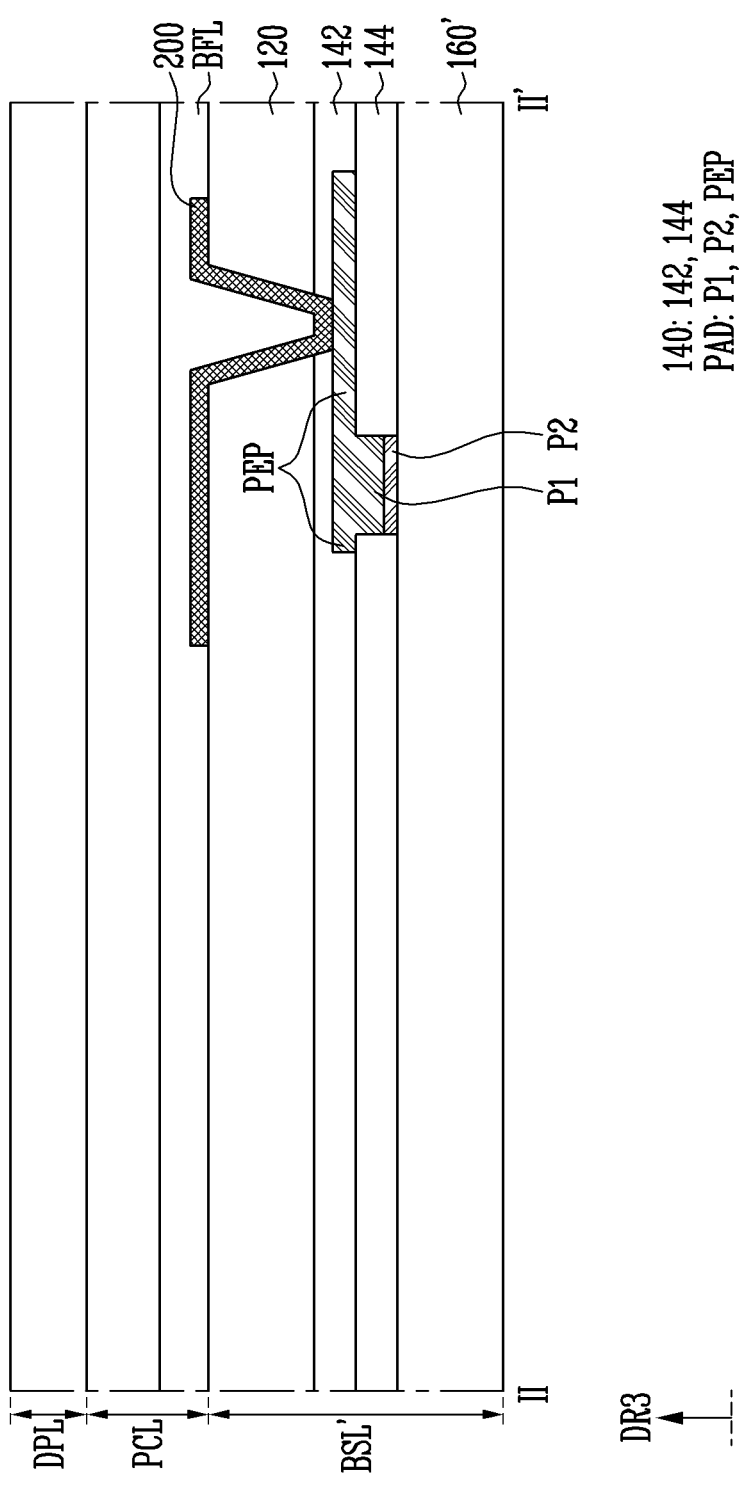
Figure 17:
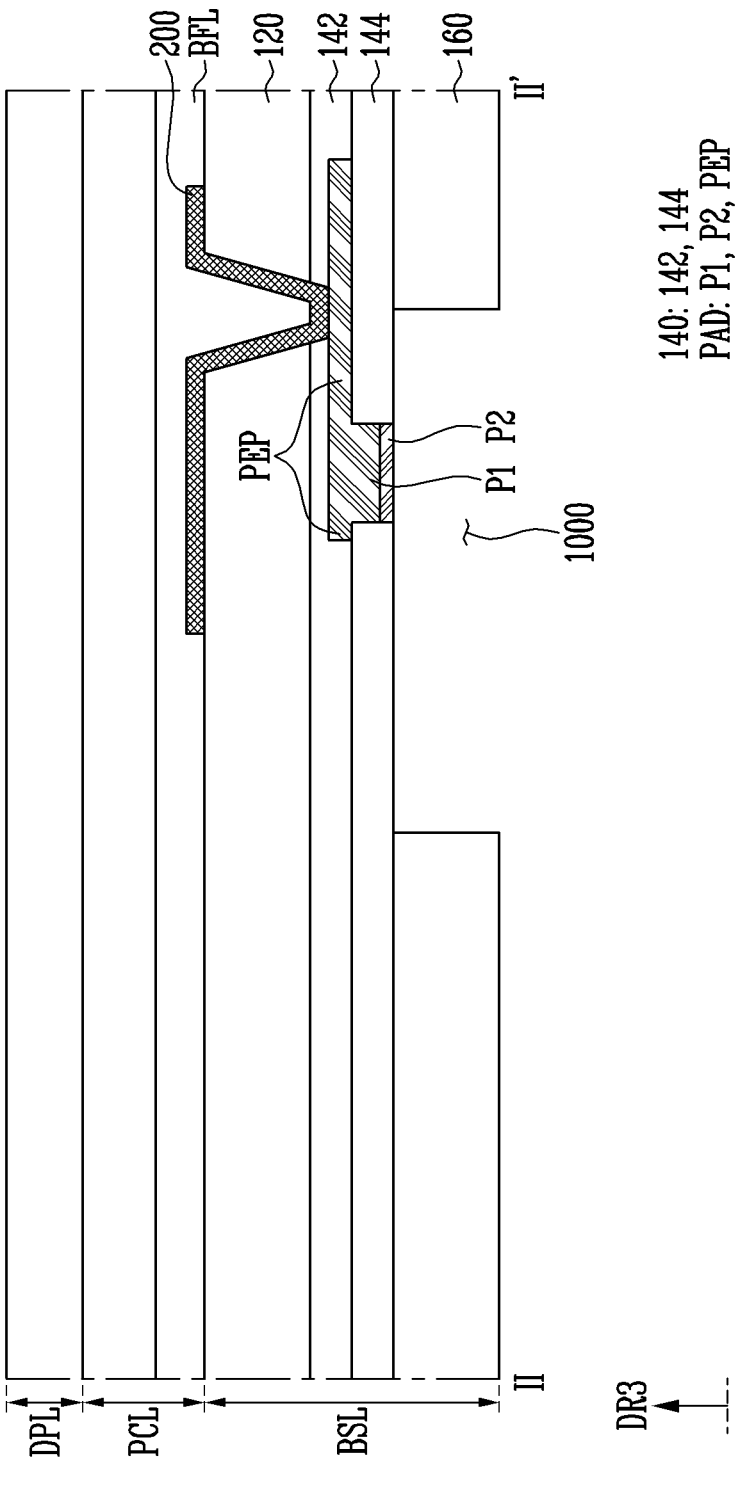
Figure 18:
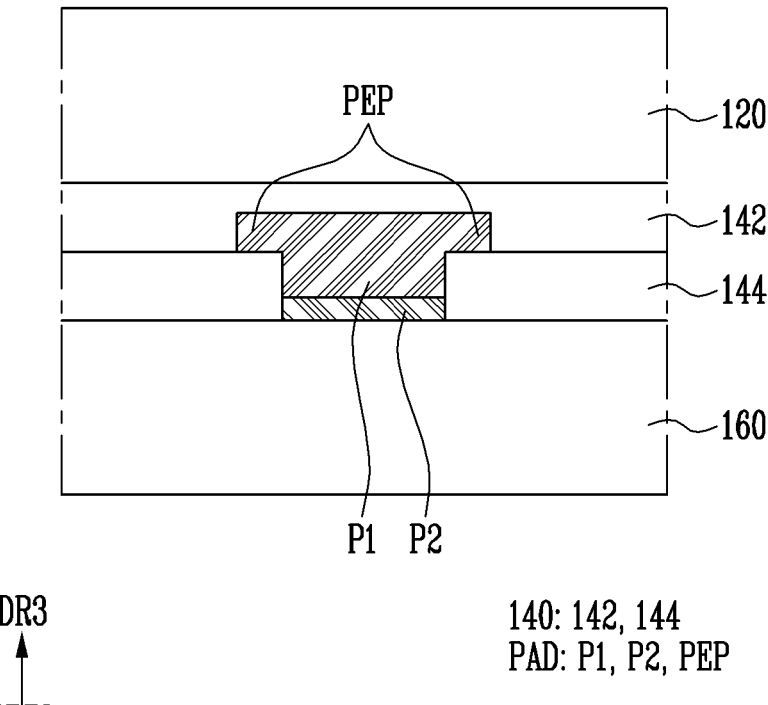
Figure 19:
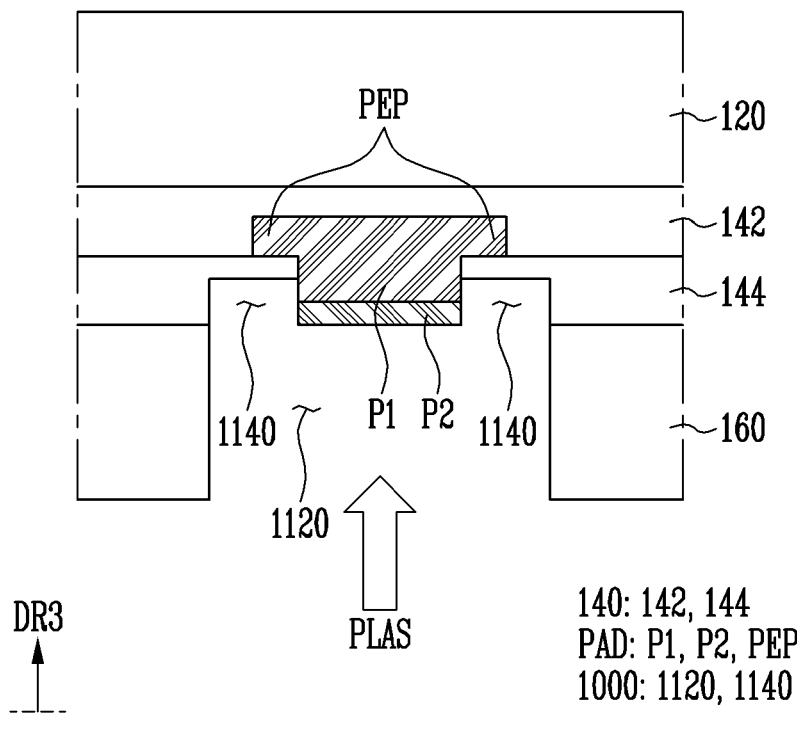
Figure 20:
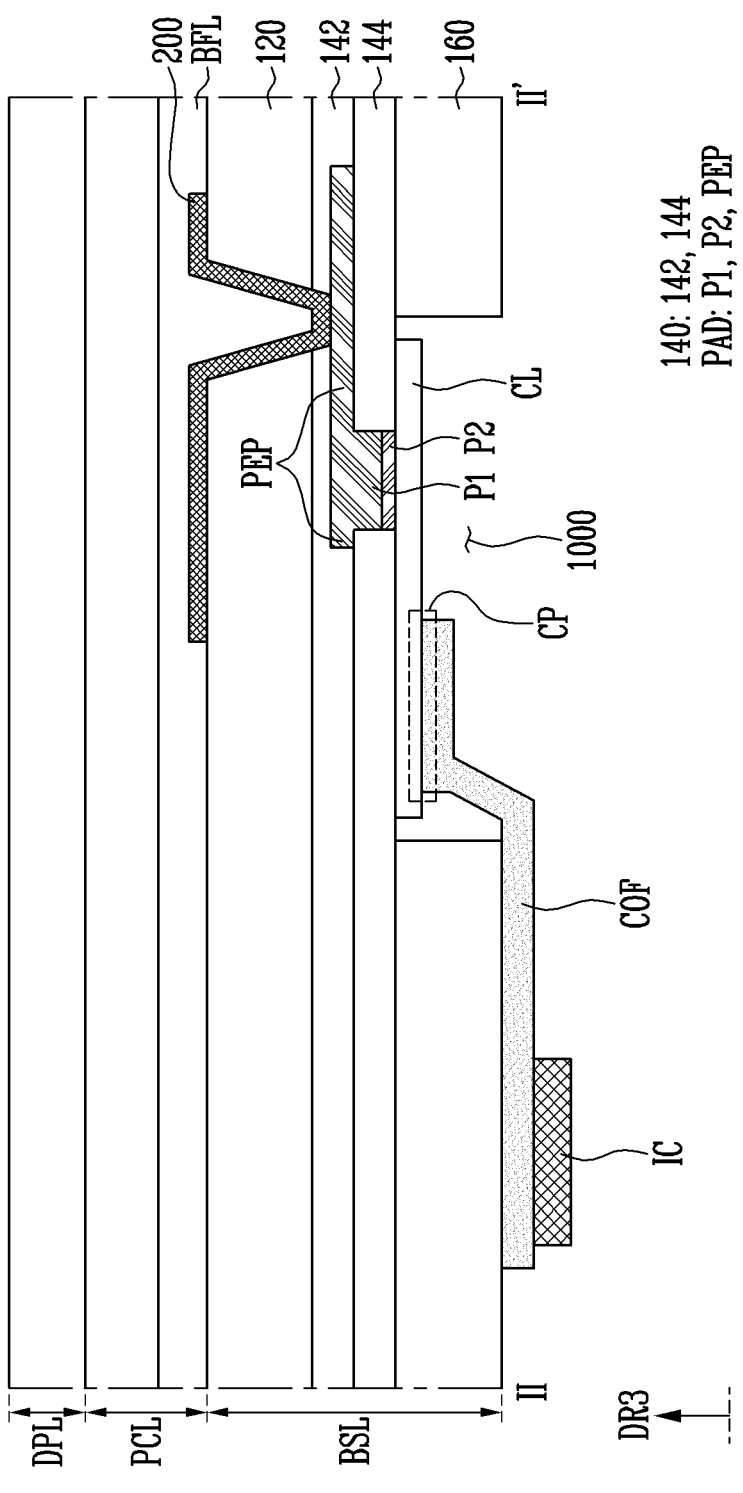

FIGS. 15, 16, and 18 may be cross-sectional views illustrating a method of manufacturing the display device DD before the plasma etching process PLSA is performed. FIGS. 17, 19, and 20 may be cross-sectional views illustrating a method of manufacturing the display device DD when (or after) the plasma etching process PLSA is performed.

FIG. 15 is a cross-sectional view schematically illustrating a method of manufacturing the display device DD according to one or more embodiments and shows a before being etched-base layer BSL' (which may also be referred to as an unetched base layer), a pixel circuit layer PCL, and a display element layer DPL, which are sequentially stacked. FIG. 16 is a cross-sectional structure including the before being etched-base layer BSL', and shows an area corresponding to the cross-sectional structure taken along line II-II' of FIG. 4. FIG. 17 is a cross-sectional structure including the base layer BSL, and shows an area corresponding to the cross-sectional structure taken along line II-II' of FIG. 4 before the chip-on-film COF is provided. FIG. 18 shows a partial area of the before being etched-base layer BSL', and shows the cross-sectional structure of the pads PAD before being exposed. FIG. 19 shows a partial area of the base layer BSL, and shows the cross-sectional structure of the pads PAD after being exposed. FIG. 20 is a cross-sectional structure including the base layer BSL, and shows an area corresponding to the cross-sectional structure taken along the line II-II' of FIG. 4 after the chip-on-film COF is provided.

Referring to FIGS. 15, 16, and 18, the before being etched-base layer BSL' may be formed (provided). The pixel circuit layer PCL may be disposed (or provided) on the base layer BSL'. The display element layer DPL may be disposed (or provided) on the pixel circuit layer PCL.

In this phase, the before being etched-base layer BSL' may be manufactured. The before being etched-base layer BSL' may be manufactured by sequentially disposing (or patterning) a second before being etched-base layer (or lower unetched base layer) 160', the second barrier layer 144, the second pad layer P2, the first pad layer P1 (or the first pad layer P1 and the extension pad layer PEP), the first barrier layer 142, and the first base layer 120. For example, the second before being etched-base layer 160' may be provided, and the pads PAD may be disposed on the second before being etched-base layer 160'. The barrier layer 140 may be disposed on the second before being etched-base layer 160', and the first base layer 120 may be patterned on the barrier layer 140. According to one or more embodiments, the pads PAD may be patterned to be disposed between the first base layer 120 and the second before being etched-base layer 160'.

According to one or more embodiments, a conductive layer may be deposited and the first pad layer P1 may have a thickness in a range of about 6,000 Å to about 9,000 Å. For example, according to one or more embodiments, a conductive layer including copper (Cu) may be deposited and the second pad layer P2 may be manufactured. A conductive layer including IZO may be deposited, and the second pad layer P2 may have a thickness in a range of about 500 Å to about 700 Å.

According to one or more embodiments, an inorganic layer including a material (e.g., a predetermined or selectable material) may be deposited and the first barrier layer 142 may have a thickness in a range of about 1,000 Å to about 3,000 Å. In order to form the first barrier layer 142, a 1-1-th layer including silicon nitride (SiNx) and a 1-2-th layer including silicon oxynitride (SiOxNy) may be alternately disposed. An inorganic layer including a material (e.g., a predetermined or selectable material) may be deposited, and the second barrier layer 144 may have a thickness in a range of about 5,000 Å to about 7,000 Å. For example, in order to form the second barrier layer 144, a 2-1-th layer including amorphous silicon and a 2-2-th layer including silicon oxide (SiOx) may be alternately disposed.

In this phase, individual components of the before being etched-base layer BSL', the pixel circuit layer PCL, and the display element layer DPL may be manufactured (or formed) by patterning a conductive layer (or a metal layer), an inorganic material, or an organic material through a process using a general mask.

In this phase, a hole may be formed in the first base layer 120 so that the lower connection electrode 200 and the pads PAD (or the extension pad layer PEP) are electrically connected to each other, and a portion of the lower connection electrode 200 may be filled in the hole when the lower connection electrode 200 is deposited. Accordingly, the lower connection electrode 200 may be electrically connected to the pads PAD. Meanwhile, although not shown in the drawings, the data lines DL of the pixel circuit layer PCL may be patterned to be electrically connected to the lower connection electrode 200.

In this phase, in order to form the display element layer DPL, alignment electrodes ELT may be patterned, and the light emitting elements LD may be aligned between the alignment electrodes ELT. For example, the light emitting elements LD may be disposed on the before being etched-base layer BSL'.

In this phase, in order to form the pads PAD, the second pad layer P2 and the first pad layer P1 may be sequentially patterned (or formed). For example, the second pad layer P2 may be disposed on the second before being etched-base layer 160', and then the first pad layer P1 may be disposed to be electrically connected to the second pad layer P2. A portion of the conductive layers deposited to dispose the second pad layer P2 may be disposed on the second barrier layer 144. Accordingly, the extension pad layer PEP may be provided. According to one or more embodiments, the second pad layer P2 may be adjacent to the second before being etched-base layer 160' and may be in contact with the second before being etched-base layer 160'.

Referring to FIGS. 17 to 19, at least a portion of the second before being etched-base layer 160' may be removed, and the second base layer 160 may be manufactured. For example, the plasma etching process PLSA may be performed on the second before being etched-base layer 160'. According to one or more embodiments, when the plasma etching process PLSA is performed, the pose of the stacked structure including the manufactured before being etched-base layer BSL' may be changed and the before being etched-base layer BSL' may face downward with respect to the direction of gravity. However, the disclosure is not limited thereto, and for convenience of description, cross-sectional structures in which the direction of the stacked structure including the manufactured before being etched-base layer BSL' is not changed are shown.

In this phase, at least a portion of the second before being etched-base layer 160' may be etched. Accordingly, the second base layer 160 in which at least portions are spaced apart from each other may be formed. According to one or more embodiments, the open area 1000 may be formed. Accordingly, at least a portion of the second pad layer P2 and at least a portion of the second barrier layer 144 may be exposed. Accordingly, in case that a subsequent process is performed, the pads PAD may be electrically connected to other components (e.g., the connection line CL).

According to one or more embodiments, the open area 1000 may define the main open area 1120 and the sub-open area 1140. For convenience of description, the structure of the pads PAD according to the first embodiment described above with reference to FIG. 10 is shown in FIG. 19. For example, by forming the sub-open area 1140, at least a portion of the side surface of the first pad layer P1 may be exposed, and a surface and the side surface of the second pad layer P2 may be exposed. However, the disclosure is not limited thereto. For example, the degree to which the second barrier layer 144 is etched may be changed by controlling the number of process cycles, process intensity, process environment, and the like of the plasma etching process PLSA. For example, the plasma etching process PLSA may be performed to expose at least the second pad layer P2, and the degree to which the second barrier layer 144 is etched may be controlled as necessary. Accordingly, the pads PAD according to the first to fifth embodiments may be manufactured.

According to one or more embodiments, the plasma etching process PLSA may be a dry etching process. According to one or more embodiments, nitrogen trifluoride (NF$_3$) gas may be used in the plasma etching process PLSA. The plasma etching process PLSA may be performed using nitrogen trifluoride (NF$_3$), and a process time required for the process exposing at least a portion of the pads PAD (e.g., the process of forming the second base layer 160) may be substantially reduced.

When the plasma etching process PLSA is experimentally performed using nitrogen trifluoride gas, the second before being etched-base layer 160' may be rapidly etched, and some of the pads PAD may be damaged depending on the composition of the pads PAD. However, according to one or more embodiments, the second pad layer P2 including IZO may be disposed on the outer periphery of the pads PAD adjacent to the second before being etched-base layer 160' on which the plasma etching process PLSA is performed. The second pad layer P2 including IZO may be resistant to external influences even when the plasma etching process PLSA using nitrogen trifluoride gas is performed. Accordingly, the second pad layer P2 may substantially reduce the risk that the pads PAD are damaged. As a result, since the pads PAD are prevented from being damaged, the reliability of the electrical signal (e.g., the data signal) supplied through the pads PAD may be substantially reconsidered (or improved).

According to one or more embodiments, the second pad layer P2 may include IZO, and the degree of freedom in the process of the plasma etching process PLSA may be improved. For example, experimentally, in case that the second pad layer P2 does not block external influences, the process parameters (e.g., the number of process cycles and the like) of the etching process may be strictly controlled to prevent damage to the pads PAD. However, since the second pad layer P2 may block (e.g., effectively block) external influences, the process parameters of the plasma etching process PLSA may be variously changed as needed. Likewise in this case, the risk that the pads PAD are damaged may not substantially occur.

For example, by not forming the outer periphery of the pads PAD using generally available metals (e.g., titanium (Ti)) in consideration of electrical conductivity, a risk that the metals are damaged by the plasma etching process PLSA may be substantially reduced.

Referring to FIG. 20, the chip-on-film COF may be disposed on the rear surface of the base layer BSL, and the chip-on-film COF may be electrically connected to the pads PAD.

In this phase, the connection line CL may be patterned in the open area 1000 and electrically connected to the second pad layer P2. An end of the chip-on-film COF may be disposed on the connection line CL, and the chip-on-film COF and the connection line CL may be electrically connected to each other through the connection portion CP. Another end of the chip-on-film COF may be disposed on the rear surface of the second base layer 160. According to one or more embodiments, the driving chip IC may be disposed on the chip-on-film COF or mounted on a portion of the chip-on-film COF.

Although not separately shown in the drawings, a lower layer for covering individual components may be formed on the rear surface of the display device DD on which the chip-on-film COF is formed. The lower layer may include polyethylene terephthalate (PET) or the like, but is not limited thereto. The color conversion layer CCL and the color filter layer CFL may be formed on the display element layer DPL. Accordingly, the display device DD according to the embodiments may be manufactured.

According to the embodiments of the disclosure, a display device capable of substantially improving reliability of an electrical signal by preventing damage to pads, and a method of manufacturing the same may be provided.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a base layer including:
an upper base layer; and
a lower base layer on a rear surface of the upper base layer;
at least one light emitting element on a surface of the upper base layer; and
at least one pad on the rear surface of the upper base layer and including:
a first pad layer adjacent to the upper base layer; and
a second pad layer adjacent to the lower base layer,
wherein the second pad layer includes indium zinc oxide (IZO),
wherein the lower base layer does not overlap the second pad layer and forms an open area in a plan view.

2. The display device of claim 1, further comprising:
a display area in which a pixel including the at least one light emitting element is disposed;
a non-display area adjacent to at least a portion of the display area;
a driving chip that provides an electrical signal to the pixel; and
a chip-on-film on which the driving chip is provided, wherein
the at least one pad is electrically connected to the chip-on-film, and
the chip-on-film and the driving chip overlap the display area in a plan view.

3. The display device of claim 2, further comprising:
a lower connection electrode on the surface of the upper base layer and electrically connected to the at least one pad.

4. The display device of claim 3, wherein
the at least one pad each includes an extension pad layer, the extension pad layer and the first pad layer are integral with each other, and the lower connection electrode is electrically connected to the extension pad layer.

5. The display device of claim 1, wherein the base layer further includes a barrier layer between the upper base layer and the lower base layer, the barrier layer includes:

a first barrier layer adjacent to the upper base layer; and a second barrier layer adjacent to the lower base layer, and the first barrier layer covers a surface of the first pad layer.

6. The display device of claim 5, wherein the second barrier layer covers a portion of a side surface of the first pad layer, exposes another portion of the side surface of the first pad layer, and does not cover a side surface of the second pad layer, and the at least one pad protrudes with respect to the barrier layer.

7. The display device of claim 6, wherein a thickness of a protrusion of the at least one pad protruding with respect to the barrier layer is greater than a thickness of the second pad layer.

8. The display device of claim 7, wherein the thickness of the protrusion is in a range of about 4,000 Å to about 7,000 Å, and the thickness of the second pad layer is in a range of about 500 Å to about 700 Å.

9. The display device of claim 5, wherein the second barrier layer covers an entire side surface of the first pad layer and exposes at least a portion of a side surface of the second pad layer.

10. The display device of claim 5, wherein the second barrier layer exposes an entire side surface of the second pad layer.

11. The display device of claim 1, wherein the display device is provided as a tiled display device including a plurality of display devices.

12. An electronic device comprising the display device of claim 1.

13. A display device comprising:

a base layer including:

an upper base layer; and a lower base layer on a rear surface of the upper base layer;

at least one light emitting element on a surface of the upper base layer; and at least one pad on the rear surface of the upper base layer and including:

a first pad layer adjacent to the upper base layer; and a second pad layer adjacent to the lower base layer, wherein the second pad layer includes indium zinc oxide (IZO), the base layer further includes a barrier layer between the upper base layer and the lower base layer, the barrier layer includes:

a first barrier layer adjacent to the upper base layer; and a second barrier layer adjacent to the lower base layer, the first barrier layer covers a surface of the first pad layer, the upper base layer includes polyimide, the lower base layer includes polyimide, the first barrier layer has a structure in which a layer including silicon nitride and a layer including silicon oxynitride are alternately disposed, and the second barrier layer has a structure in which a layer including amorphous silicon and a layer including silicon oxide are alternately disposed.

\* \* \* \* \*